United States Patent
Lee et al.

(10) Patent No.: US 9,125,295 B2
(45) Date of Patent: Sep. 1, 2015

(54) SUBSTRATE SEPARATION APPARATUS AND METHOD

(71) Applicant: Samsung Display Co., Ltd., Yongin, Gyeonggi-Do (KR)

(72) Inventors: Seung Jun Lee, Yongin-si (KR); Young Woo Lee, Gwangmyeong-si (KR); Joon Hyung Kim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/063,108

(22) Filed: Oct. 25, 2013

(65) Prior Publication Data

US 2014/0338828 A1    Nov. 20, 2014

(30) Foreign Application Priority Data

May 14, 2013  (KR) .................. 10-2013-0054463

(51) Int. Cl.
| | |
|---|---|
| *B32B 38/10* | (2006.01) |
| *H05K 3/00* | (2006.01) |
| *H01L 21/683* | (2006.01) |
| *H01L 21/70* | (2006.01) |

(Continued)

(52) U.S. Cl.
CPC .............. *H05K 3/007* (2013.01); *B32B 38/10* (2013.01); *B32B 38/1858* (2013.01); *H01L 21/6835* (2013.01); *H01L 21/707* (2013.01); *H01L 51/003* (2013.01); *B32B 43/006* (2013.01); *B32B 2457/20* (2013.01); *B32B 2457/206* (2013.01); *G02F 1/1303* (2013.01); *G02F 1/133305* (2013.01); *H05K 2203/0147* (2013.01); *Y10T 156/1168* (2015.01); *Y10T 156/1184* (2015.01); *Y10T 156/1961* (2015.01); *Y10T 156/1967* (2015.01); *Y10T 156/1978* (2015.01)

(58) Field of Classification Search
CPC .............................. B32B 38/10; B32B 43/006
See application file for complete search history.

(56) References Cited

U.S. PATENT DOCUMENTS 3,775,211 A * 11/1973 Gill .............................. 156/205
4,477,263 A * 10/1984 Shaver et al. ..................... 95/7
(Continued)

FOREIGN PATENT DOCUMENTS

| EP | 0218873 | 4/1987 |
|---|---|---|
| KR | 1020100078476 A | 7/2010 |

(Continued)

OTHER PUBLICATIONS

European Office Action-European Application No. 141665182 dated Jun. 10, 2015.

*Primary Examiner* — Philip Tucker
*Assistant Examiner* — Nickolas Harm
(74) *Attorney, Agent, or Firm* — Cantor Colburn LLP

(57) ABSTRACT

An apparatus for separating a first substrate and a second substrate which are in contact with each other, includes an upper transfer part which fixes the first substrate and transfers the first substrate in a positive X-axis direction in an XY coordinate system comprised of an X axis and an Y axis which perpendicularly intersect each other and a lower transfer part which is disposed under the upper transfer part with a gap therebetween and fixes and transfers the second substrate, wherein the lower transfer part comprises a first transfer section which transfers the second substrate in the positive X-axis direction, and a second transfer section which transfers the second substrate in the positive X-axis direction as well as a negative Y-axis direction.

8 Claims, 21 Drawing Sheets

(51) Int. Cl.
  *H01L 51/00*  (2006.01)
  *B32B 38/18*  (2006.01)
  *B32B 43/00*  (2006.01)
  *G02F 1/13*   (2006.01)
  *G02F 1/1333* (2006.01)

(56) References Cited

U.S. PATENT DOCUMENTS

| | | | | |
|---|---|---|---|---|
| 4,724,032 A * | 2/1988 | Kay | ............... | 156/717 |
| 5,306,378 A * | 4/1994 | Takimoto et al. | ............. | 156/717 |
| 5,478,434 A * | 12/1995 | Kerr et al. | ............. | 156/760 |
| 5,540,809 A * | 7/1996 | Ida et al. | ............. | 156/760 |
| 6,227,276 B1 * | 5/2001 | Kim et al. | ............. | 156/763 |
| 6,500,298 B1 * | 12/2002 | Wright et al. | ............. | 156/708 |
| 7,484,640 B2 * | 2/2009 | von Falkenhausen et al. | ............. | 221/231 |
| 8,080,277 B2 * | 12/2011 | Takashima et al. | ............. | 427/66 |
| 8,118,075 B2 * | 2/2012 | Sampica et al. | ............. | 156/762 |
| 8,349,129 B2 * | 1/2013 | Blanchard et al. | ............. | 156/717 |
| 2003/0029562 A1 * | 2/2003 | Yotsumoto et al. | ............. | 156/344 |
| 2003/0041960 A1 * | 3/2003 | Sasada | ............. | 156/247 |
| 2008/0225224 A1 * | 9/2008 | Toyoshima et al. | ............. | 349/187 |
| 2008/0290591 A1 * | 11/2008 | Shimizu | ............. | 271/208 |
| 2011/0174445 A1 * | 7/2011 | Ciliberti et al. | ............. | 156/752 |
| 2011/0253316 A1 * | 10/2011 | Kost | ............. | 156/761 |
| 2012/0319094 A1 * | 12/2012 | Furukawa et al. | ............. | 257/40 |
| 2014/0138032 A1 | 5/2014 | Kweon et al. | | |

FOREIGN PATENT DOCUMENTS

| | | |
|---|---|---|
| KR | 1020110094228 A | 8/2011 |
| KR | 1020120001721 A | 1/2012 |
| WO | 2011106827 | 9/2011 |

* cited by examiner

SUBSTRATE SEPARATION APPARATUS AND METHOD

This application claims priority to Korean Patent Application No. 10-2013-0054463, filed on May 14, 2013, and all the benefits accruing therefrom under 35 U.S.C. §119, the disclosure of which is incorporated herein by reference in its entirety.

BACKGROUND

1. Field

The invention generally relates to a substrate separation apparatus and method.

2. Description of the Related Art

Recently, an importance of electronic devices having flexibility has been increasing. Accordingly, various technologies for implementing various types of displays such as an organic light-emitting display ("OLED"), an electrophoretic display ("EPD"), a plasma display panel ("PDP"), a thin-film transistor ("TFT"), a microprocessor and a random access memory ("RAM"), for example, on a flexible substrate are required.

To manufacture an electronic device on a flexible substrate, a method of attaching a flexible substrate onto a carrier substrate made of a hard material and forming an electronic device has been suggested. In this method, a process of separating the carrier substrate and the flexible substrate is performed.

However, the electronic device can be damaged or cracked in the process of separating the carrier substrate and the flexible substrate, the carrier substrate and the flexible substrate may not be smoothly separated due to static electricity generated in the separation process, and contamination may occur when foreign substances adhere to the carrier substrate and the flexible substrate due to static electricity.

SUMMARY

One or more exemplary embodiment of the invention provides a substrate separation apparatus and method which can stably separate a first substrate and a flexible second substrate.

One or more exemplary embodiment of the invention also provides a substrate separation apparatus and method which can minimize contamination by controlling static electricity in a substrate separation process.

However, exemplary embodiments of the invention are not restricted to the one set forth herein. The above and other exemplary embodiment of the invention will become more apparent to one of ordinary skill in the art to which the invention pertains by referencing the detailed description of the invention given below.

According to an exemplary embodiment of the invention, there is provided an apparatus for separating a first substrate and a second substrate which are in contact with each other. The apparatus includes an upper transfer part which fixes the first substrate and transfers the first substrate in a positive X-axis direction in an XY coordinate system composed of an X axis and an Y axis which perpendicularly intersect each other, and a lower transfer part which is disposed under the upper transfer part with a gap therebetween and fixes and transfers the second substrate, where the lower transfer part includes a first transfer section which transfers the second substrate in the positive X-axis direction and a second transfer section which transfers the second substrate in the positive X-axis direction as well as a negative Y-axis direction.

According to another exemplary embodiment of the invention, there is provided an apparatus for separating a first substrate and a second substrate which are in contact with each other. The apparatus includes an upper transfer part which fixes a top surface of the first substrate and transfers the first substrate along a straight line, a lower transfer part which is disposed under the upper transfer part, fixes a bottom surface of the second substrate, and transfers the second substrate, where the lower transfer part includes a first transfer section and a second transfer section by which the second substrate is transferred, a vertical distance from the straight line to the first transfer section is constant, and a vertical distance from the straight line to the second transfer section increases as a distance from the first transfer section increases.

According to another exemplary embodiment of the invention, there is provided an apparatus for separating a first substrate and a second substrate which are in contact with each other. The apparatus includes an upper transfer part which fixes and transfers the first substrate, a lower transfer part which is disposed under the upper transfer part with a gap therebetween and fixes and transfers the second substrate, where the lower transfer part includes a first transfer section and a second transfer section which has a first side continuous with the first transfer section, and a second side of the second transfer section is located at a relatively lower position than the first transfer section.

According to another exemplary embodiment of the invention, there is provided a method of separating a first substrate and a second substrate which are in contact with each other. The method includes fixing a bottom surface of the second substrate and a top surface of the first substrate, transferring, in a first area, the first substrate and the second substrate in a positive X-axis direction in an XY coordinate system composed of an X axis and an Y axis which perpendicularly intersect each other, and gradually separating the first substrate and the second substrate, in a second area, by transferring the first substrate in the positive X-axis direction at the same time as transferring the second substrate in the positive X-axis direction and a negative Y-axis direction.

According to another exemplary embodiment of the invention, there is provided a method of separating a first substrate and a second substrate which are in contact with each other. The method includes fixing a bottom surface of the second substrate and a top surface of the first substrate, transferring the first substrate along a straight line, and transferring the second substrate at the same time as the transferring of the first substrate. The transferring of the second substrate includes gradually separating the first substrate and the second substrate by transferring the second substrate in a first transfer section of which a vertical distance from the straight line remains unchanged and transferring the second substrate in a second transfer section of which a vertical distance from the straight line increases.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
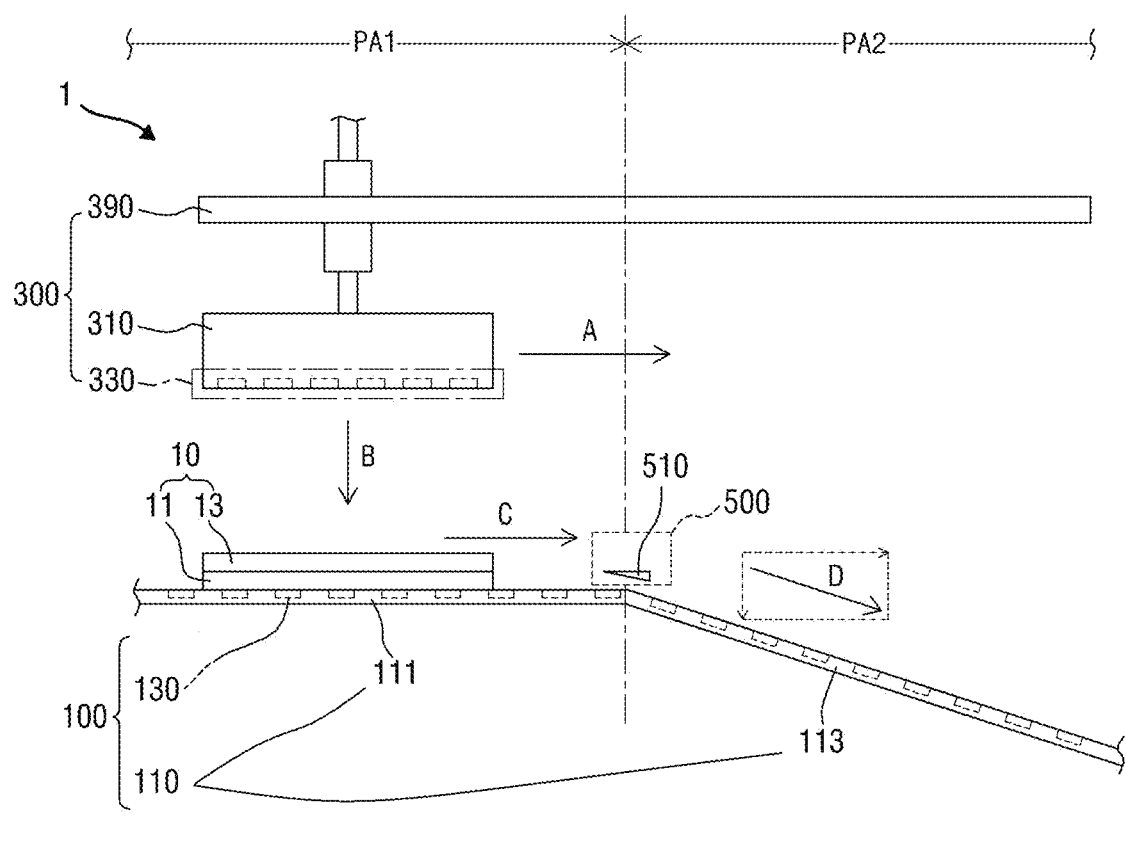
FIG. 1 is a schematic cross-sectional view of an exemplary embodiment of a substrate separation apparatus according to the invention.
Figure 1:
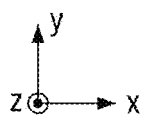

Advantages and features of the invention and methods of accomplishing the same may be understood more readily by reference to the following detailed description of exemplary embodiments and the accompanying drawings. The invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the invention will only be defined by the appended claims. Like numbers refer to like elements throughout. In the drawings, sizes and relative sizes of layers and regions may be exaggerated for clarity.

It will be understood that when an element or layer is referred to as being "on" another element or layer, it can be directly on the other element or layer or intervening elements or layers may be present.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term, "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described with reference to the attached drawings.

FIG. 1 is a schematic cross-sectional view of a substrate separation apparatus 1 according to an exemplary embodiment of the invention.

Referring to FIG. 1, the substrate separation apparatus 1 according to the invention is configured to separate a stacked structure 10 of a second substrate 11 and a first substrate 13, which is disposed on the second substrate 11 to contact the second substrate 11, into the second substrate 11 and the first substrate 13.

The second substrate 11 of the stacked structure 10 may be flexible and may include any form as long as it is flexible. In one exemplary embodiment, the second substrate 11 may be a film, a sheet or a flexible printed circuit board ("FPCB"), for example. In addition, the second substrate 11 may include an electronic device having flexibility. The electronic device may be one or more displays selected from a group including an organic light-emitting diode ("OLED") display, a white organic light-emitting diode ("WOLED") display, and a liquid crystal display ("LCD"). The second substrate 11 may also include a flexible insulating substrate (e.g., a polyimide substrate) and the electronic device mounted on the flexible insulating substrate.

The first substrate 13 may be flexible or rigid. In one exemplary embodiment, the first substrate 13 may be a film, a sheet or an electronic device including the film or the sheet, for example. In another exemplary embodiment, the first substrate 13 may be a rigid carrier substrate or a window of a display, for example. When the first substrate 13 is rigid, the first substrate 13 may be, but is not limited to, any one of a glass substrate, a quartz substrate, a sapphire substrate, and a ceramic substrate.

The substrate separation apparatus 1 for separating the second substrate 11 and the first substrate 13 may include a lower transfer part 100 and an upper transfer part 300 which is disposed on the lower transfer part 100 with a gap therebetween and may further include a separator 500.

The lower transfer part 100 is configured to fix and transfer the second substrate 11. The lower transfer part 100 may include a lower holding unit 110 which contacts a bottom surface of the second substrate 11 of the stacked structure 10 disposed thereon, a lower fixing unit 130 which fixes a bottom surface of the stacked structure 10, specifically, the bottom surface of the second substrate 11, and a lower driving unit (not shown) which moves the lower holding unit 110 to transfer the second substrate 11.

The lower holding unit 110 may include a first transfer section 111 and a second transfer section 113. In the first transfer section 111, the second substrate 11 may be transferred in a C direction, that is, a positive X-axis direction. In the second transfer section 113, the second substrate 11 may be transferred in a D direction, that is, a direction indicated by the sum of the positive X-axis direction and a negative Y-axis direction. As used herein, a positive direction is a direction pointed by an arrow of each axis shown in the drawings, and a negative direction is a direction opposite to the direction pointed by the arrow of each axis shown in the drawings. In addition, ⊙ indicates that an arrow points in a forward direction of the drawings. That is, ⊙ indicates that the arrow protrudes out of the drawings. In addition, ⊗ indicates that an arrow points in a backward direction of the drawings. That is, ⊗ indicates that the arrow points in a direction opposite to the direction indicated by ⊙.

When the stacked structure 10 is mounted on the lower holding unit 110, the lower fixing unit 130 may fix the bottom surface of the second substrate 11 onto the lower holding unit 110. Then, the lower driving unit may move the lower holding unit 110. Accordingly, the second substrate 11 fixed on the lower holding unit 110 may be transferred in the C direction in the first transfer section 111 and may be transferred in the D direction in the second transfer section 113.

The upper transfer part 300 is configured to fix and transfer the first substrate 13. The upper transfer part 300 may include an upper holding unit 310 which contacts a top surface of the first substrate 13, an upper fixing unit 330 which is disposed on or in a lower part of the upper holding unit 310 and fixes the top surface of the first substrate 13, and an upper driving unit (not shown) which moves the upper holding unit 310 to transfer the first substrate 13.

The upper holding unit 310 may form the exterior of a part for transferring the first substrate 13. The size and shape of the upper holding unit 310 may be designed according to the size and shape of the first substrate 13.

In one exemplary embodiment, the upper fixing unit 330 may be disposed in the lower part of the upper holding unit 310 to fix the top surface of the first substrate 13 and may include vacuum suction portions.

In another exemplary embodiment, when the stacked structure 10 is disposed on the lower transfer part 100, the upper driving unit may move the upper holding unit 310 in a B direction, that is, the negative Y-axis direction. Accordingly, the upper holding unit 310 may contact the top surface of the first substrate 13. The upper fixing unit 330 may fix the top surface of the first substrate 13. The upper driving unit may transfer the first substrate 13 by moving the upper holding unit 310 in an A direction, that is, the positive X-axis direction. To guide the movement of the upper holding unit 310 in the B direction, an upper guide 390 may further be installed.

In a first area PA1, the first substrate 13 and the second substrate 11 may move at the same velocity. Here, the term 'velocity' denotes a vector value including a direction component and a magnitude component. That is, the distance and direction of travel of the first substrate 13 in the first area PA1 may be the same as the distance and direction of travel of the second substrate 11 in the first area PA1. In other words, in the first area PA1, the stacked structure 10 may be transferred along the first transfer section 111 in a state where the first substrate 13 and the second substrate 11 are in contact with each other and where a top surface of the stacked structure 10 is fixed by the upper fixing unit 330 and the bottom surface of the stacked structure 10 is fixed by the lower fixing unit 130. That is, the first area PA1 may be defined as an area where the first substrate 13 and the second substrate 11 are not physically separated from each other, and the first substrate 13 and the second substrate 11 are simultaneously transferred in the same direction. The first transfer section 111 of the lower holding unit 110 on which the second substrate 11 is disposed may be defined as a portion corresponding to the first area PA1. That is, the first transfer section 111 is a portion of the lower holding unit 110 which corresponds to the first area PA1.

In a second area PA2, the first substrate 13 and the second substrate 11 may move at different velocities. Specifically, a Y-axis direction component of the movement velocity of the first substrate 13 may be different from a Y-axis direction component of the movement velocity of the second substrate 11. In one exemplary embodiment, the Y-axis direction component of the movement velocity of the first substrate 13 in the second area PA2 may be substantially zero, and the Y-axis direction component of the movement velocity of the second substrate 11 in the second transfer section 113 may have a negative Y-axis value, for example. An X-axis direction component of the movement velocity of the first substrate 13 in the second area PA2 may be the same as or different from an X-axis direction component of the movement velocity of the second substrate 11 in the second transfer section 113.

That is, in the second transfer section 113, the second substrate 11 moves relative to the first substrate 13 with respect to the negative Y-axis direction. Since the second substrate 11 and the first substrate 13 move relative to each other in a state where the bottom surface of the second substrate 11 is fixed by the lower fixing unit 130 and the top surface of the first substrate 13 is fixed by the upper fixing unit 330, they may be gradually separated from each other. That is, the second area PA2 may be defined as an area where the first substrate 13 and the second substrate 11 are separated from each other as they move relative to each other in the Y-axis direction. The second transfer section 113 of the lower holding unit 110 on which the second substrate 11 is disposed may be defined as a portion corresponding to the second area PA2. That is, the second transfer section 113 may be a portion of the lower holding unit 110 which corresponds to the second area PA2.

As described above, since the second substrate 11 and the first substrate 13 are gradually separated from each other after entering the second area PA2, they can be separated stably while minimizing stress applied to the second substrate 11 or the first substrate 13, and the speed of separation can be adjusted. Furthermore, it is possible to effectively prevent contact on a top surface of the second substrate 11 in the substrate separation process, thereby effectively preventing the top surface of the second substrate 11 from being contaminated in the separation process.

To facilitate the separation of the second substrate 11 and the first substrate 13 in the second area PA2, the substrate separation apparatus 1 may further include the separator 500 which partially separates the first substrate 13 and the second substrate 11.

The separator 500 may include a fine-edged or sharp-edged tool such as a knife 510. The knife 510 may partially separate the second substrate 11 and the first substrate 13, which are in contact with each other, along the direction of a Z axis perpendicularly intersecting an X axis and a Y axis. That is, the separator 500 may initially separate the second substrate 11 and the first substrate 13 by using the knife 510. In one exemplary embodiment, the process of separating the first substrate 13 and the second substrate 11 using the knife 510 may be performed before the stacked structure 10 enters the second area PA2, that is, while the second substrate 11 is located in the first transfer section 111.

In other words, the second substrate 11 and the first substrate 13 in contact with each other may be partially separated along the Z-axis direction by the knife 510 of the separator 500, and the stacked structure 10 may be transferred to the second area PA2 after the first substrate 13 and the second substrate 11 are partially separated by the knife 510.

Accordingly, the second substrate 11 transferred along the second transfer section 113 in the second area PA2 and the first substrate 13 transferred along the positive X-axis direction in the second area PA2 can be separated more easily.

In one exemplary embodiment, to facilitate the process of partially separating the second substrate 11 and the first substrate 13 using the knife 510, the stacked structure 10 transferred along the first transfer section 111 in the first area PA1 may be stopped before entering the second area PA2. Then, the process of partially separating the second substrate 11 and the first substrate 13 using the knife 510 may be performed while the stacked structure 10 is stationary.

Figure 2:
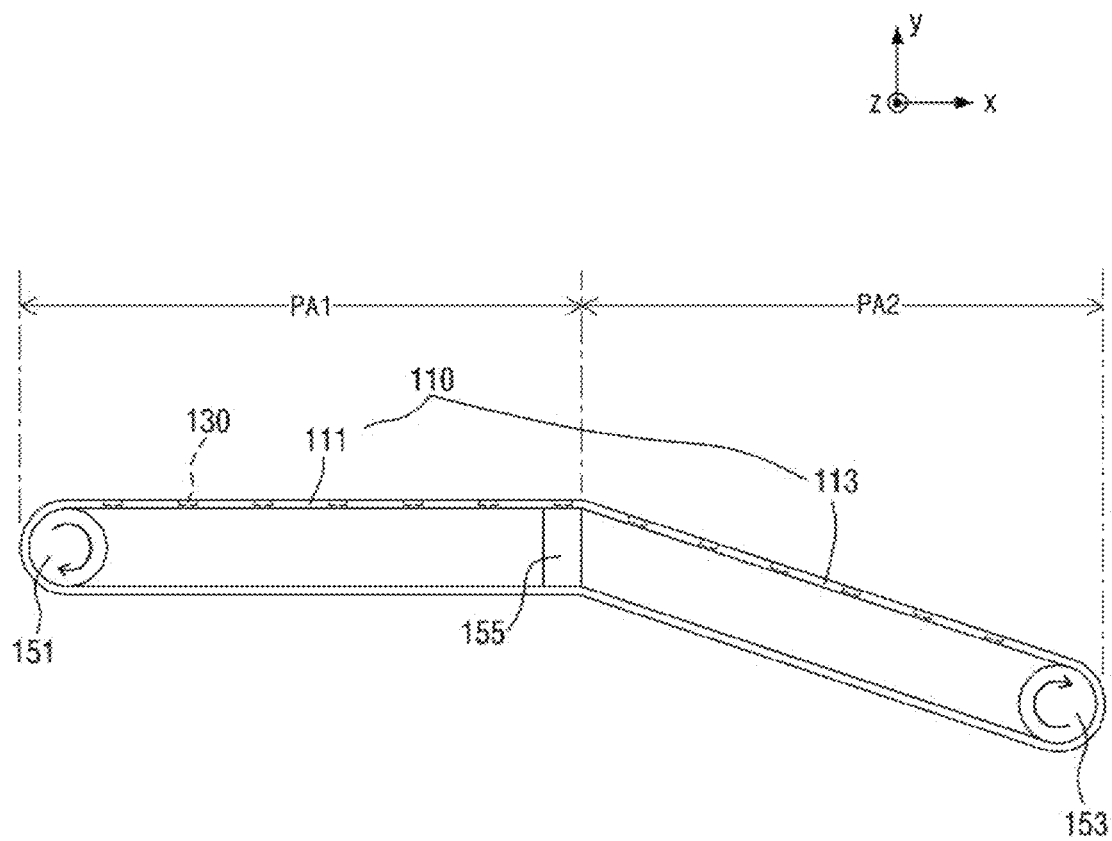
FIG. 2 is a cross-sectional view illustrating the schematic structure of an exemplary embodiment of a lower transfer part shown in FIG. 1.
Figure 3:
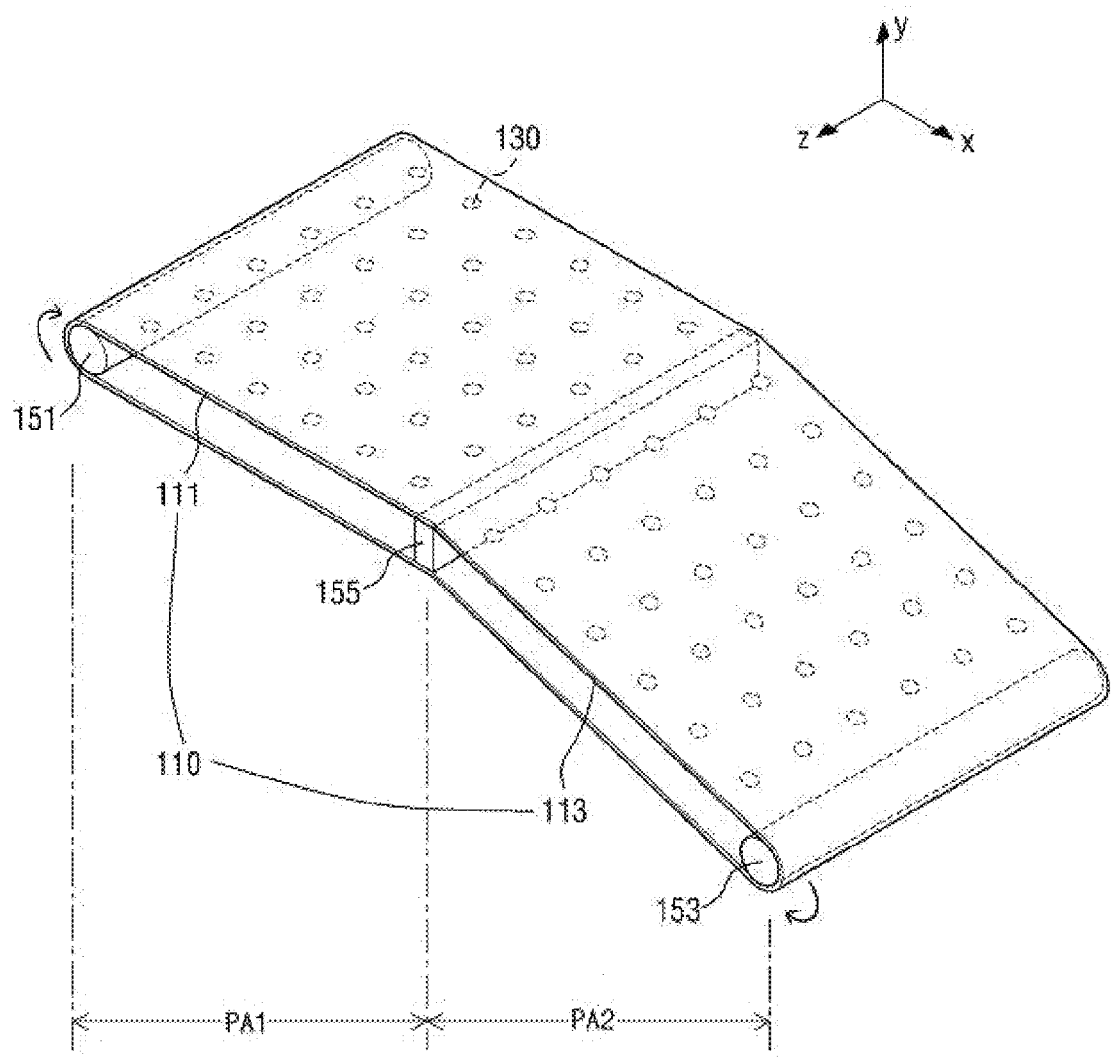
FIG. 3 is a perspective view illustrating the schematic structure of the exemplary embodiment of the lower transfer part shown in FIG. 1.

FIGS. 2 and 3 are a cross-sectional view and a perspective view illustrating the schematic structure of an exemplary embodiment of the lower transfer part 100 shown in FIG. 1.

Referring to FIGS. 2 and 3, a lower transfer part 100 (see FIG. 1) may include a lower holding unit 110 and a lower fixing unit 130, as described above with reference to FIG. 1, and further include a lower driving unit (151, 153).

Like the second substrate 11 (see FIG. 1), the lower holding unit 110 may be flexible. In one exemplary embodiment, the lower holding unit 110 may be formed in the form of, for example, a transfer belt or a conveyor belt. However, the form of the lower holding unit 110 is not limited to those set forth herein. That is, the lower holding unit 110 may be formed in all forms (e.g., a flexible plate) that can reflect a change (e.g., bending) in the shape of the flexible second substrate 11 (see FIG. 1). While the lower holding unit 110 is described as a transfer belt as an exemplary embodiment below, the invention is not limited to the exemplary embodiment.

When the lower holding unit 110 is a transfer belt, a first transfer section 111 may be defined as a portion of the lower holding unit 110 which corresponds to the first area PA1 described above with reference to FIG. 1, and a second transfer section 113 may be defined as a portion of the lower holding unit 110 which corresponds to the second area PA2 described above with reference to FIG. 1.

In one exemplary embodiment, the lower fixing unit 130 may include a plurality of vacuum holes formed in the lower holding unit 110 and vacuum-suck the second substrate 11 (see FIG. 1) disposed on the lower holding unit 110. That is, when the second substrate 11 (see FIG. 1) is disposed on the lower holding unit 110, the lower fixing unit 130 may suck in air through the holes, thereby creating a vacuum between the lower holding unit 110 and the second substrate 11 (see FIG. 1). Accordingly, the second substrate 11 (see FIG. 1) may be fixed to the lower holding unit 110. However, this is merely an exemplary embodiment, and the lower fixing unit 130 may also include a vacuum suction pad or a rubber suction pad formed on the lower holding unit 110. That is, all means of suction that have been developed and commercialized or are realizable depending on future technological developments can be used as the lower fixing unit 130 of the invention.

The lower driving unit (151, 153) generates a driving force for transferring the second substrate 11 (see FIG. 1) fixed on the lower holding unit 110. When the lower holding unit 110 is formed in the form of a transfer belt or a conveyor belt, the lower driving unit (151, 153) may be formed in the form of driving rollers. The driving rollers may include a first lower driving roller 151 disposed at a side of the lower holding unit 110 and a second lower driving roller 153 disposed at the other side of the lower holding unit 110. That is, in one exemplary embodiment, the lower driving unit (151, 153) may be formed in the form of rollers, and the rollers may rotate in directions indicated by arrows to transfer the second substrate 11 (see FIG. 1) fixed on the lower holding unit 110 in the positive X-axis direction. However, the above description is merely an exemplary embodiment, and there is no restriction on the form of the lower driving unit (151, 153).

A lower guide 155 for guiding the lower holding unit 110 may further be provided between the first transfer section 111 and the second transfer section 113 of the lower transfer unit 100 (see FIG. 1). That is, the lower holding unit 110 may be divided into the first transfer section 111 and the second transfer section 113 by the lower guide 155.

In one exemplary embodiment, the lower guide 155 may be shaped as a hexagonal pillar having flat top and bottom surfaces as shown in FIGS. 2 and 3. However, this is merely an exemplary embodiment, and the lower guide 155 can have various shapes such as cylinders, rollers, etc.

Figure 4:
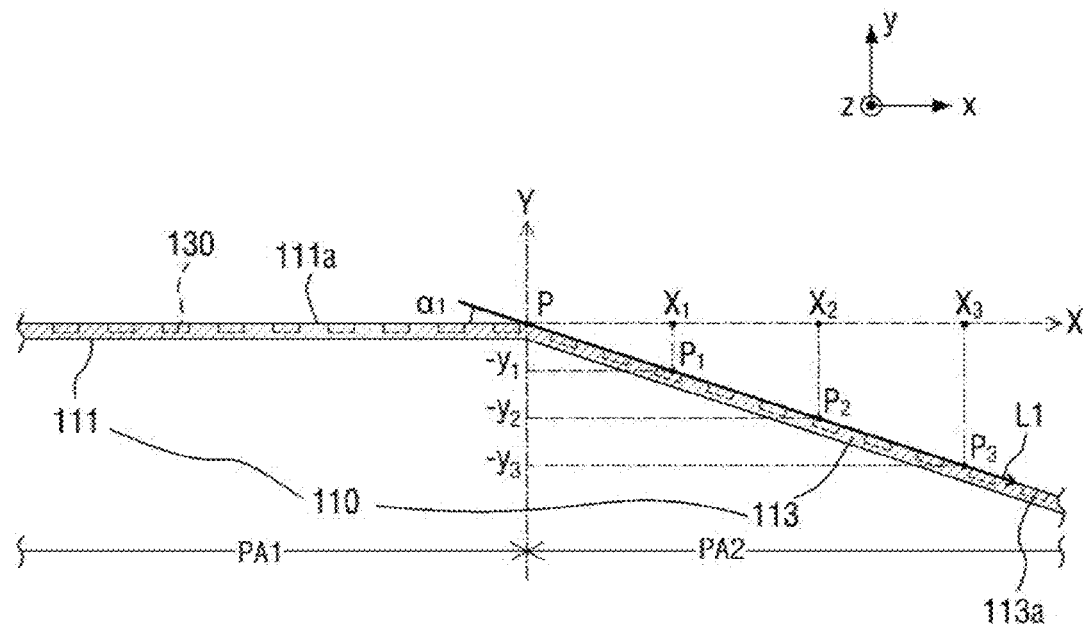
FIG. 4 is a cross-sectional view illustrating an exemplary embodiment of a first transfer section and a second transfer section shown in FIG. 1.

FIG. 4 is a cross-sectional view illustrating an exemplary embodiment of the first transfer section 111 and the second transfer section 113 shown in FIG. 1.

Referring to FIG. 4, a first transfer section 111 according to the illustrated embodiment may be shaped like a flat surface parallel to the X axis, and the second substrate 11 (see FIG. 1) may be transferred along the positive X-axis direction in the first transfer section 111.

A second transfer section 113 according to the illustrated embodiment is continuous with the first transfer section 111. In the second transfer section 113, the second substrate 11 (see FIG. 1) may move in the positive X-axis direction as well as in the negative Y-axis direction. That is, the second substrate 11 (see FIG. 1) on the second transfer section 113 is transferred in a direction having a negative slope in an XY coordinate system.

A top surface 113a of the second transfer section 113 of the lower holding unit 110 may contact a straight line L1 having a negative slope. That is, the straight line L1 is a tangent line to the top surface 113a of the second transfer section 113 in the XY coordinate system. The slope of the straight line L1 may be constant across the entire top surface 113a of the second transfer section 113.

Specifically, assuming that a boundary between a top surface 111a of the first transfer section 111 and the top surface 113a of the second transfer section 113 is the origin P of the XY coordinate system, the origin P may have coordinate values of (0, 0). In addition, a first position P1, a second position P2, and a third position P3 on the second transfer section 113 may have coordinate values of (x1, −y1), (x2, −y2) and (x3, −y3), respectively, where xn and yn have positive real number values, and n is a positive integer. Here, a slope of a straight line that contacts the first position P1, a slope of a straight line that contacts the second position P2, and a slope of a straight line that contacts the third position P3 may be equal. In other words, the second transfer section 113 may include a flat surface sloping downward, that is, a flat sloped surface. Accordingly, the first position P1, the second position P2 and the third position P3 projected onto the XY coordinate system may be located on the same straight line L1 in the XY coordinate system.

An acute angle α1 formed by the straight line L1 and a positive X axis in the XY coordinate system may be in a range of greater than about 0 degree to about 45 degrees. That is, an angle measured along a clockwise direction from the top surface 113a of the second transfer section 113 to the top surface 111a of the first transfer section 111 may range from greater than about 135 degrees to less than about 180 degrees. In other words, an angle measured along the clockwise direction from the top surface 111a of the first transfer section 111 to the top surface 113a of the second transfer section 113 may range from greater than about 180 degrees to less than about 225 degrees. However, this is merely an exemplary embodiment, and the angle formed by the top surface 111a of the first transfer section 111 and the top surface 113a of the second transfer section 113 may be changed appropriately when necessary.

Figure 5:
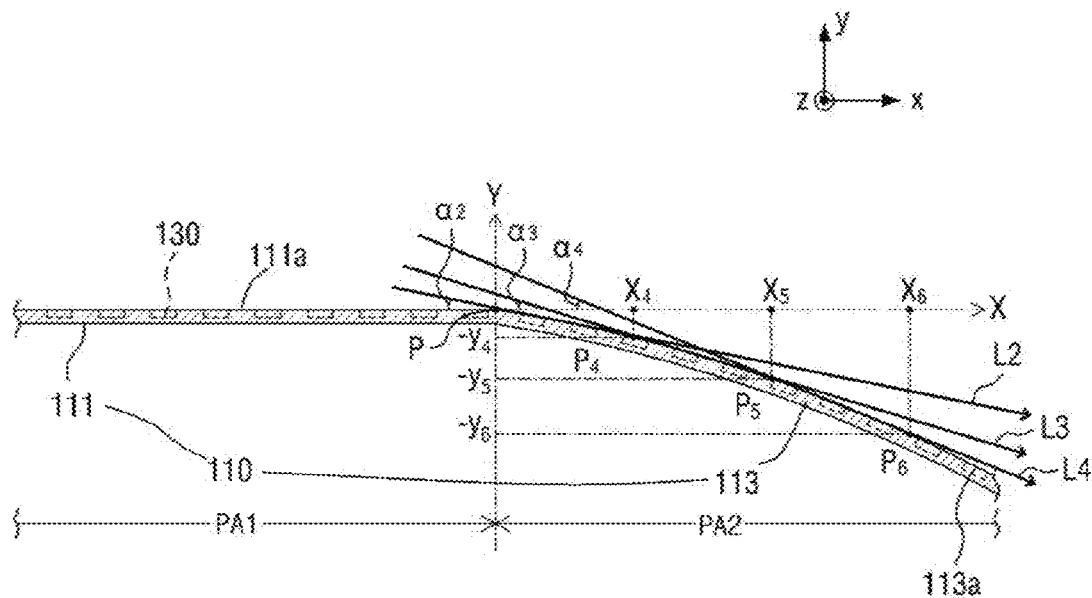
FIG. 5 is a cross-sectional view illustrating another exemplary embodiment of the first transfer section and the second transfer section shown in FIG. 1.

FIG. 5 is a cross-sectional view illustrating another exemplary embodiment of the first transfer section 111 and the second transfer section 113 shown in FIG. 1. The structure shown in FIG. 5 is similar to the structure shown in FIG. 4 except for the shape of the second transfer section 113.

Referring to FIG. 5, a top surface 113a of a second transfer section 113 may contact straight lines L2, L3 and L4 having negative slopes. That is, the straight lines L2, L3 and L4 are tangent lines to the top surface 113a of the second transfer section 113 in an XY coordinate system.

The slopes of the straight lines L2, L3 and L4 may increase as the distance from a first transfer section 111 increases. That is, assuming that a boundary between a top surface 111a of the first transfer section 111 and the top surface 113a of the second transfer section 113 is the origin P of the XY coordinate system, the origin P may have coordinate values of (0, 0). In addition, a fourth position P4, a fifth position P5, and a sixth position P6 on the second transfer section 113 may have coordinate values of (x4, −y4), (x5, −y5) and (x6, −y6), respectively. Here, the slope of the straight line L2 that contacts the fourth position P4 may be gentler than the slope of the straight line L3 that contacts the fifth position P5, and the slope of the straight line L3 that contacts the fifth position P5 may be gentler than the slope of the straight line L4 that contacts the sixth position P6. That is, an absolute value of the slope of each straight line may increase as the distance from the first transfer section 111 increases.

That is, the second transfer section 113 may include a curved surface sloping downward. Accordingly, the fourth position P4, the fifth position P5 and the sixth position P6 projected onto an XY plane formed by the XY coordinate system may be located on the same curve in the XY coordinate system, and the slope of the tangent line L2, L3 or L4 to each position P4, P5 or P6 may increase as the distance from the first transfer section 111 increases.

Here, acute angles α2, α3 and α4 formed by the positive X axis and the straight lines L2, L3 and L4 that respectively contact the fourth position P4, the fifth position P5 and the sixth position P6 may increase as the distance from the first transfer section 111 increases. That is, the relationship among the acute angles α2, α3 and α4 may be α2<α3<α4 in FIG. 5.

Figure 6:
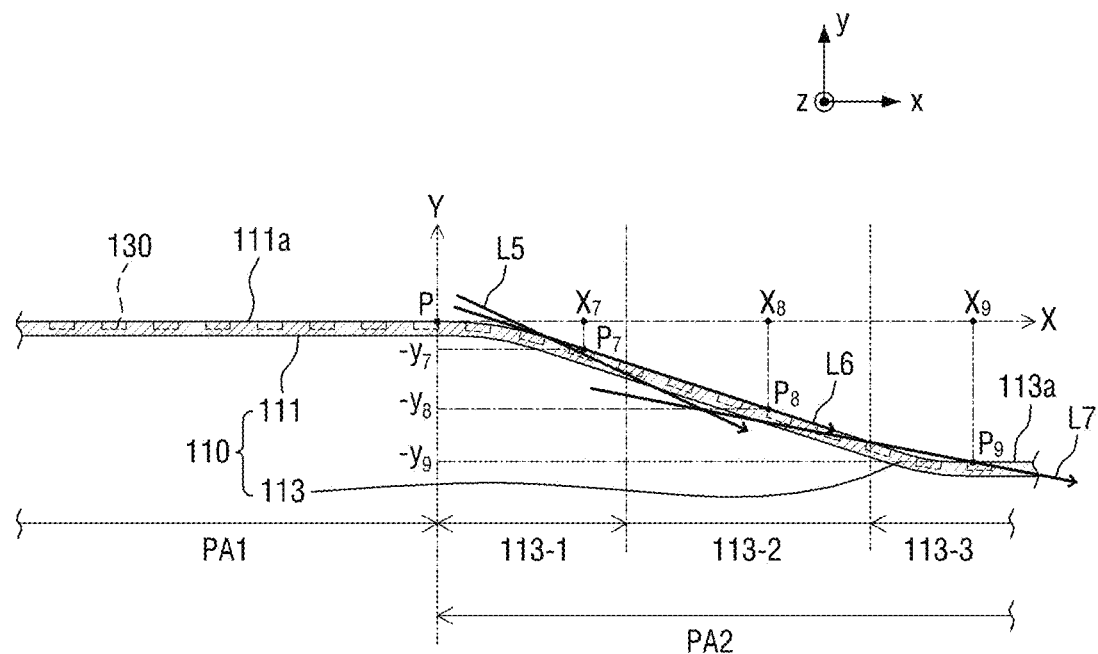
FIG. 6 is a cross-sectional view illustrating another exemplary embodiment of the first transfer section and the second transfer section shown in FIG. 1.

FIG. 6 is a cross-sectional view illustrating another exemplary embodiment of the first transfer section 111 and the second transfer section 113 shown in FIG. 1. The structure shown in FIG. 6 is similar to the structures shown in FIGS. 4 and 5 except for the shape of the second transfer section 113.

Referring to FIG. 6, a top surface 113a of a second transfer section 113 may contact straight lines L5, L6 and L7 having negative slopes. That is, the straight lines L5, L6 and L7 are tangent lines to the top surface 113a of the second transfer section 113 in an XY coordinate system.

Assuming that a boundary between a top surface 111a of a first transfer section 111 and the top surface 113a of the second transfer section 113 is the origin P of the XY coordinate system, the origin P may have coordinate values of (0, 0). In addition, a seventh position P7 located in a first section 113-1 of the top surface 113a of the second transfer section 113 may have coordinate values of (x7, −y7). Here, the slope of the tangent line L5 to the seventh position P7 may increase as the value of x7 within the first section 113-1 increases. That is, the first section 113-1 may include a curved surface sloping downward, and a slope of the curved surface of the first section 113-1 may increase as the distance from the first transfer section 111 increases.

An eighth position P8 located in a second section 113-2 (continuous with the first section 113-1) of the top surface 113a of the second transfer section 113 may have coordinate values of (x8, −y8). Here, even when the value of x8 within the second section 113-2 increases, the slope of the tangent line L6 to the eighth position P8 may remain constant. That is, the second section 113-2 may include a flat surface sloping downward, i.e., a flat sloped surface.

A ninth position P9 located in a third section 113-3 (continuous with the second section 113-2) of the top surface 113a of the second transfer section 113 may have coordinate values of (x9, −y9). Here, as the value of x9 within the third section 113-3 increases, the slope of the tangent line L7 to the ninth position P9 may decrease. That is, the third section 113-3 may include a curved surface sloping downward, and a slope of the curved surface of the third section 113-3 may be reduced as the distance from the first transfer section 111 increases. However, this is merely an exemplary embodiment, and, although not shown in FIG. 6, a slope of a tangent line L7 to the ninth position P9 may also increase as the value of x9 within the third section 113-3 increases. That is, the third section 113-3, like the first section 113-1, may include a curved surface sloping downward, and a slope of the curved surface of the third section 113-3 may increase as the distance from the first transfer section 111 increases.

As described above, the second transfer section 113 according to the illustrated embodiment may include a sloping surface, and the sloping surface may include a combination of a curved surface, a flat surface, and a curved surface.

Although not shown in FIG. 6, positions of the first through third sections 113-1 through 113-3 can be changed. That is, the second section 113-2 may be formed at a position continuous with the first transfer section 111, and the first section 113-1 and the third section 113-3 may be formed sequentially. In FIG. 6, the top surface 113a of the second transfer section 113 includes two curved surfaces and one flat surface. However, this is merely an exemplary embodiment. That is, there is no restriction on the respective numbers and positions of flat surfaces and curved surfaces that form the top surface 113a of the second transfer section 113. The top surface 113a of the second transfer section 113 may also include only a plurality of flat surfaces having different slopes or only a plurality of curved surfaces having different slopes.

Figure 7:
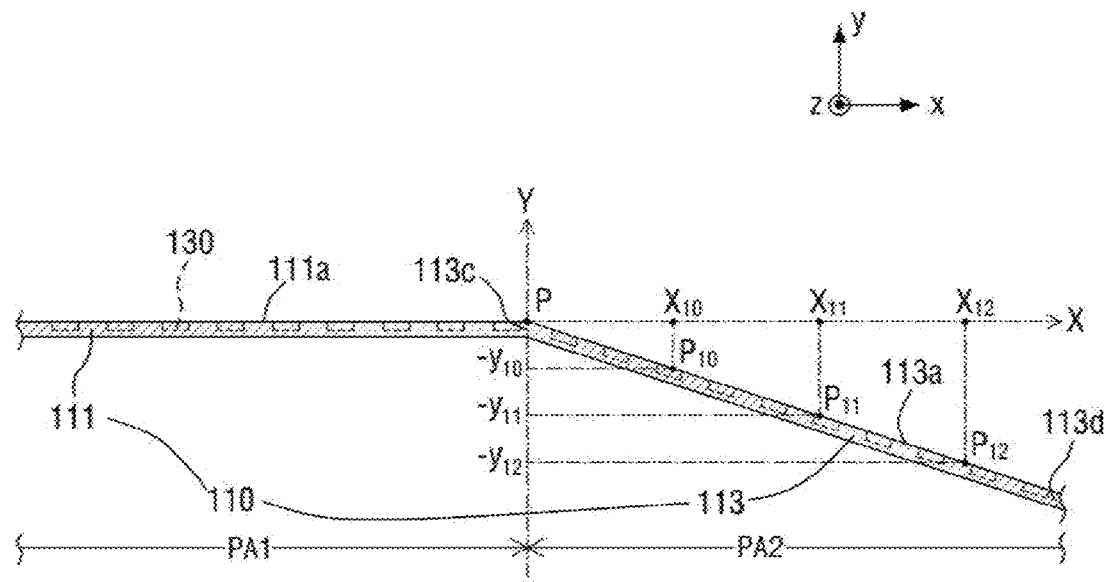
FIG. 7 is a cross-sectional view of another exemplary embodiment of the first transfer section and the second transfer section shown in FIG. 1.

FIG. 7 is a cross-sectional view of another exemplary embodiment of the first transfer section 111 and the second transfer section 113 shown in FIG. 1.

Referring to FIG. 7, a first transfer section 111 according to the illustrated embodiment may include a flat surface, and the second substrate 11 (see FIG. 1) may be transferred along the positive X-axis direction in the first transfer section 111.

A first side 113c of a second transfer section 113 may contact the first transfer section 111, and a second side 113d of the second transfer section 113 may be located at a lower position than the first transfer section 111. A height difference between the first transfer section 111 and the second transfer section 113 may gradually increase from the first side 113c of the second transfer section 113 toward the second side 113d. That is, the second transfer section 113 may slope in a direction from the first side 113c toward the second side 113d.

In the illustrated embodiment, the height difference between the first transfer section 111 and the second transfer section 113 may increase at a constant rate from the first side 113c of the second transfer section 113 toward the second side 113d. Assuming that a boundary between a top surface 111a of the first transfer section 111 and a top surface 113a of the second transfer section 113 is the origin P of an XY plane, the origin P may have coordinates of (0, 0), for example. In addition, arbitrary points, i.e., a tenth position P10, an eleventh position P11, and a twelfth position P12 on the top surface 113a of the second transfer section 113 may have coordinates of (x10, −y10), (x11, −y11) and (x12, −y12), respectively. Here, y10/x10=y11/x11=y12/x12 or (y11−y10)/(x11−x10)=(y12−y11)/(x12−x11). That is, the height difference between the top surface 111a of the first transfer section 111 and the top surface 113a of the second transfer section 113 may increase at a constant rate from the first side 113c of the second transfer section 113 toward the second side 113d thereof. Accordingly, the top surface 113a of the second transfer section 113 may include a flat surface sloping in a direction from the first side 113c toward the second side 113d.

Figure 8:
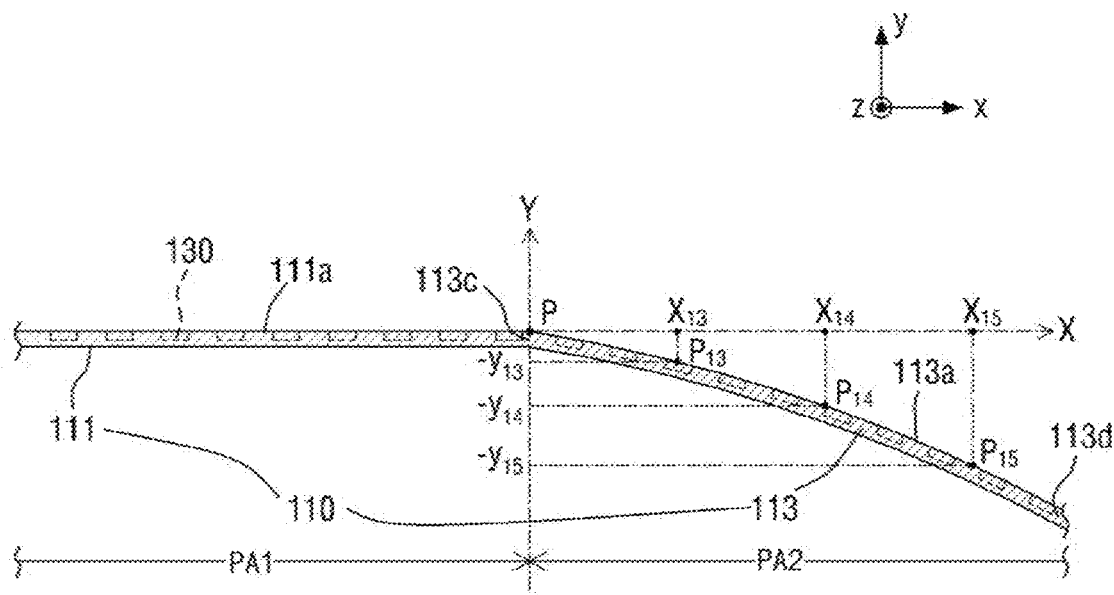
FIG. 8 is a cross-sectional view of another exemplary embodiment of the first transfer section and the second transfer section shown in FIG. 1.

FIG. 8 is a cross-sectional view of another exemplary embodiment of the substrate transfer section, i.e., the first transfer section 111 and the second transfer section 113 shown in FIG. 1. The structure shown in FIG. 8 is similar to the structure shown in FIG. 7 except for the shape of the second transfer section 113.

Referring to FIG. 8, in the illustrated embodiment, a height difference between a top surface 111a of a first transfer section 111 and a top surface 113a of a second transfer section 113 may increase from a first side 113c of the second transfer section 113 toward a second side 113d. Here, the rate of increase in the height difference may increase from the first side 113c toward the second side 113d. Assuming that a boundary between the top surface 111a of the first transfer section 111 and the top surface 113a of the second transfer section 113 is the origin P of an XY coordinate system, the origin P may have coordinates of (0, 0), for example. In addition, arbitrary points, i.e., a thirteenth position P13, a fourteenth position P14, and a fifteenth position P15 on the top surface 113a of the second transfer section 113 may have coordinates of (x13, −y13), (x14, −y14) and (x15, −y15), respectively. Here, y13/x13<y14/x14<y15/x15 or (y14−y13)/(x14−x13)<(y15−y14)/(x15−x14). That is, the height difference between the top surface 111a of the first transfer section 111 and the top surface 113a of the second transfer section 113 may increase from the first side 113c of the second transfer section 113 toward the second side 113d of the second transfer section 113. In addition, the rate of increase in the height difference may increase from the first side 113c of the second transfer section 113 toward the second side 113d. Accordingly, the top surface 113a of the second transfer section 113 may include a curved surface sloping in a direction from the first side 113c toward the second side 113d as shown in FIG. 8.

Figure 9:
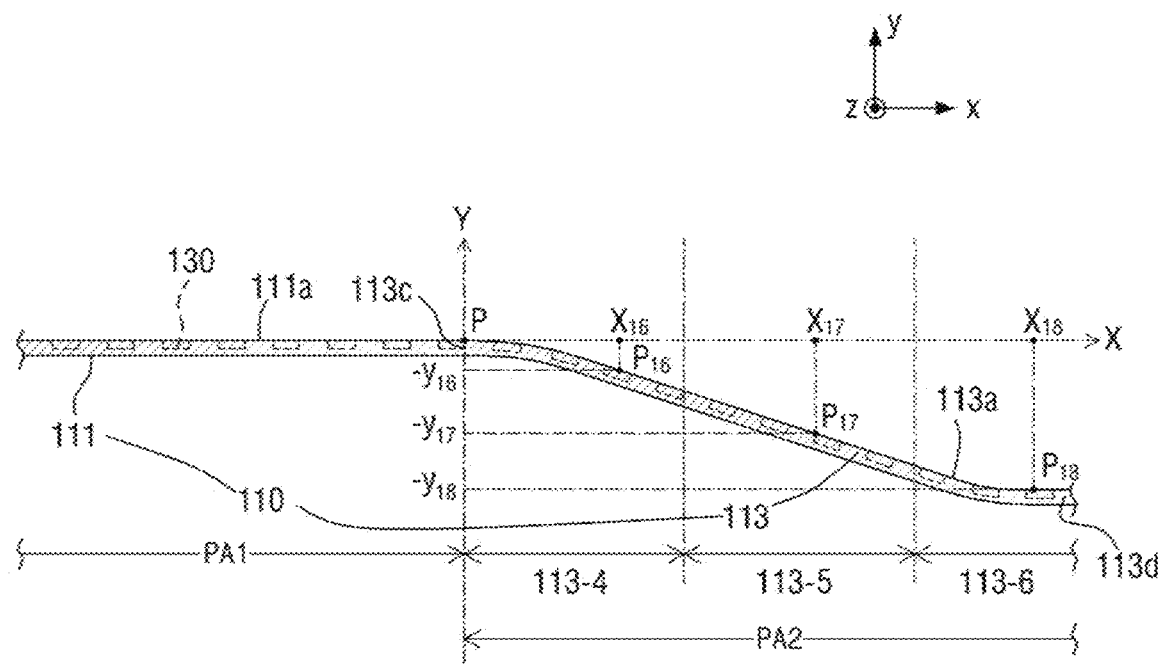
FIG. 9 is a cross-sectional view of another exemplary embodiment of the first transfer section and the second transfer section shown in FIG. 1.

FIG. 9 is a cross-sectional view of another exemplary embodiment of the substrate transfer section, i.e., the first transfer section 111 and the second transfer section 113, shown in FIG. 1. The structure shown in FIG. 9 is similar to the structure shown in FIG. 6 except for the shape of the second transfer section 113.

That is, a second transfer section 113 according to the illustrated embodiment may include a combination of a plurality of curved sections (113-4, 113-6) and a flat section 113-5. In one exemplary embodiment, the second transfer section 113 may include one flat section and two curved sections as described below, but this is merely an exemplary embodiment, and there is no restriction on the respective numbers and positions of flat sections and curved sections.

Assuming that a boundary between a top surface 111a of a first transfer section 111 and a top surface 113a of the second transfer section 113 is the origin P of an XY coordinate system, the origin P may have coordinate values of (0, 0). In addition, a sixteenth position P16, i.e., an arbitrary point located in a first curved section 113-4 of the top surface 113a of the second transfer section 113 may have coordinate values of (x16, −y16). Likewise, a seventeenth position P17, i.e., an arbitrary point located in the flat section 113-5 of the top surface 113a of the second transfer section 113 may have coordinate values of (x17, −y17), and an eighteenth position P18, i.e., an arbitrary point located in a second curved section 113-6 of the top surface 113a of the second transfer section 113 may have coordinate values of (x18, −y18).

Here, y16/x16<(y17−y16)/(x17−x16), and (y17−y16)/(x17−x16)>(y18−y17)/(x18−x17). Also, y16/x16<y17/x17, and y17/x17>y18/x18. That is, the rate of increase in a height difference between the top surface 113a of the second transfer section 113 and the top surface 111a of the first transfer section 111 may gradually increase from a first side 113c of the second transfer section 113 toward a second side 113d in the first curved section 113-4. In addition, the rate of increase in the height difference may be constant in the flat section 113-5 and may gradually decrease from the first side 113c of the second transfer section 113 toward the second side 113d in the second curved section 113-6.

Figure 10:
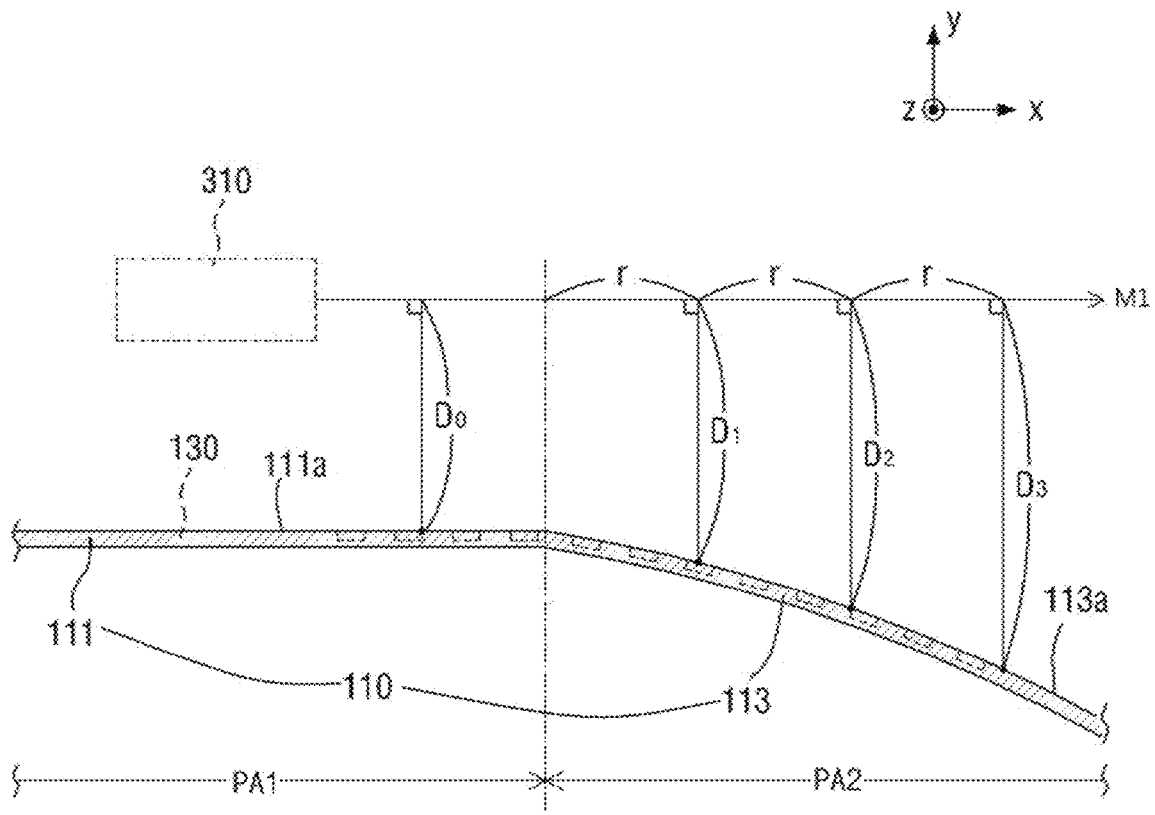
FIG. 10 is a cross-sectional view of another exemplary embodiment of the first transfer section and the second transfer section shown in FIG. 1.

FIG. 10 is a cross-sectional view of another exemplary embodiment of the first transfer section 111 and the second transfer section 113 shown in FIG. 1.

Referring to FIG. 10, the upper holding unit 310 may move along a straight line M1 at the same time as the first substrate 13 (see FIG. 1).

The second substrate 11 (see FIG. 1) may be transferred along a first transfer section 111 and a second transfer section 113 in a state where it is fixed on the lower holding unit 110.

The first transfer section 111 may be shaped like a flat surface parallel to the straight line M1, and a vertical distance D0 from the straight line M1 to a top surface 111a of the first transfer section 111 may be constant. That is, since the vertical distance D0 from the straight line M1, which corresponds to a transfer path of the first substrate 13 (see FIG. 1), to the top surface 111a of the first transfer section 111 on which the second substrate 11 (see FIG. 1) is disposed is constant, the second substrate 11 (see FIG. 1) may be transferred parallel to the first substrate 13 (see FIG. 1) in the first transfer section 111.

The second transfer section 113 slopes downward from the first transfer section 111. A vertical distance from the straight line M1 to a top surface 113a of the second transfer section 113 may gradually increase. When the upper holding unit 310 is moved by r, 2r and 3r from a boundary between the first transfer section 111 and the second transfer section 113, vertical distances from the straight line M1 to the top surface 113a of the second transfer section 113 may be D1, D2 and D3, for example. In this case, D0<D1<D2<D3.

In one exemplary embodiment, D1−D0=D2−D1=D3−D3. In this case, the top surface 113a of the second transfer section 113 may include a flat surface sloping downward.

In another exemplary embodiment, D1−D0<D2−D1<D3−D2. In this case, the top surface 113a of the second transfer section 113 may include a curved surface sloping downward as shown in FIG. 10.

That is, there is no restriction on the shape of the top surface 113a of the second transfer section 113 as long as the relationship among the above vertical distances satisfies D0<D1<D2<D3.

Figure 11:
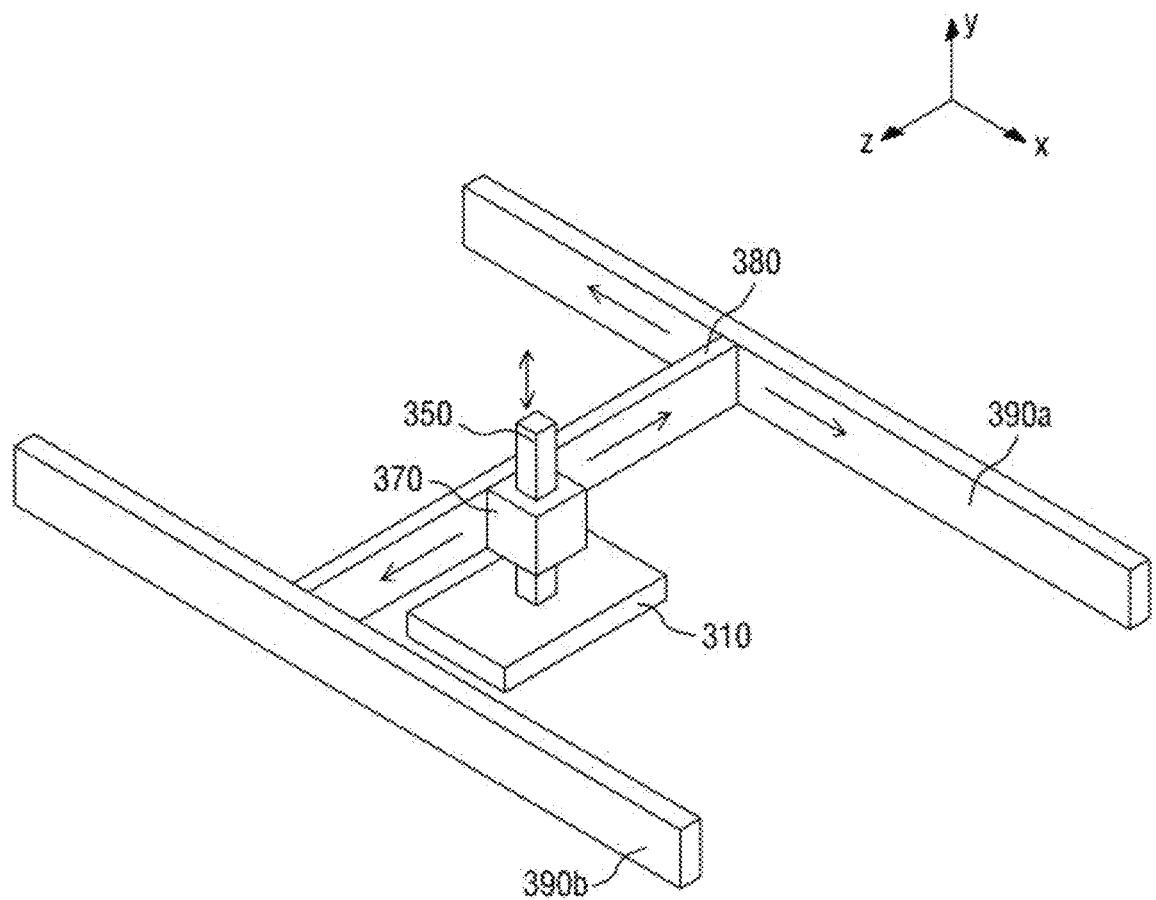
FIG. 11 is a perspective view illustrating the schematic structure of an upper transfer part shown in FIG. 1.

FIG. 11 is a perspective view illustrating the schematic structure of the upper transfer part 300 shown in FIG. 1.

Referring to FIG. 11, the upper transfer part 300 according to the invention may include the upper holding unit 310, the upper fixing unit (not shown) and the upper driving unit (not shown) and may further include a first upper support 350, a second upper support 370, and a third upper support 380.

The first upper support 350 is connected to a top surface of the upper holding unit 310 so as to support the upper holding unit 310. The first upper support 350 is moved in the Y-axis direction by the upper driving unit (not shown), thereby raising or lowering the upper holding unit 310. The first upper support 350 may be guided by the second upper support 370 to move along the Y-axis direction.

The second upper support 370 may be connected to the third upper support 380. The second upper support 370 may be moved in the Z-axis direction by the upper driving unit (not shown), thereby moving the upper holding unit 310. Here, the movement of the second upper support 370 may be guided by the third upper support 380.

The third upper support 380 may be moved in the X-axis direction by the upper driving unit (not shown), thereby moving the upper holding unit 310. Here, the movement of the third upper support 380 may be guided by upper guides 390a and 390b. As shown in the drawing, the upper guides 390a and 390b may contact both ends of the third upper support 380.

The above coupling relationship among the first upper support 350, the second upper support 370, and the third upper support 380 is merely an exemplary embodiment, and the invention is not limited thereto. That is, there is no restriction on the coupling relationship among the first upper support 350, the second upper support 370 and the third upper support 380, and the coupling relationship among them can be changed appropriately when necessary. Furthermore, any one of the first upper support 350, the second upper support 370 and the third upper support 380 can be omitted or can be integrally formed with another one.

Figure 12:
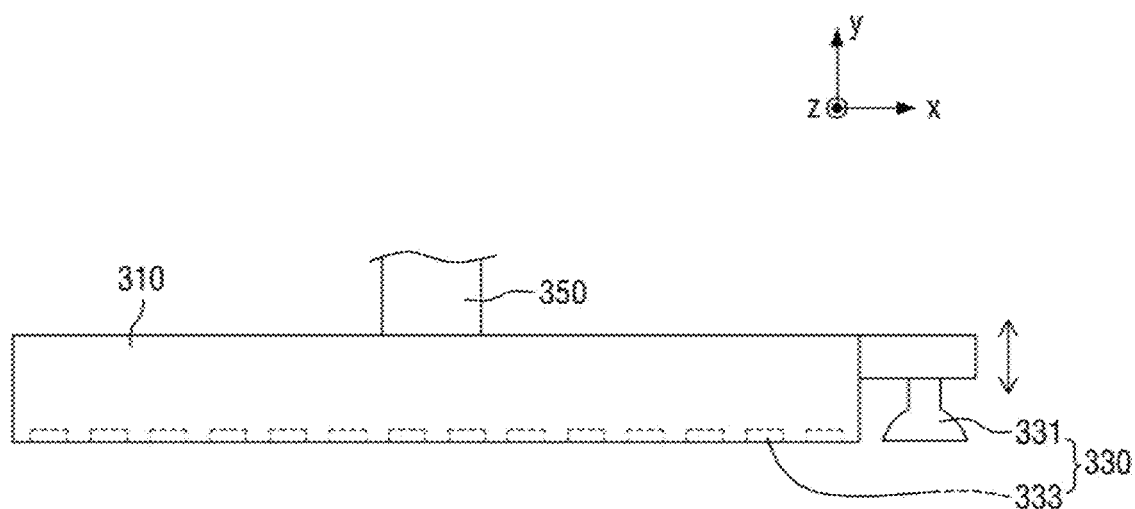
FIG. 12 is a cross-sectional view illustrating the schematic structure of an exemplary embodiment of an upper fixing unit shown in FIG. 1.
Figure 13:
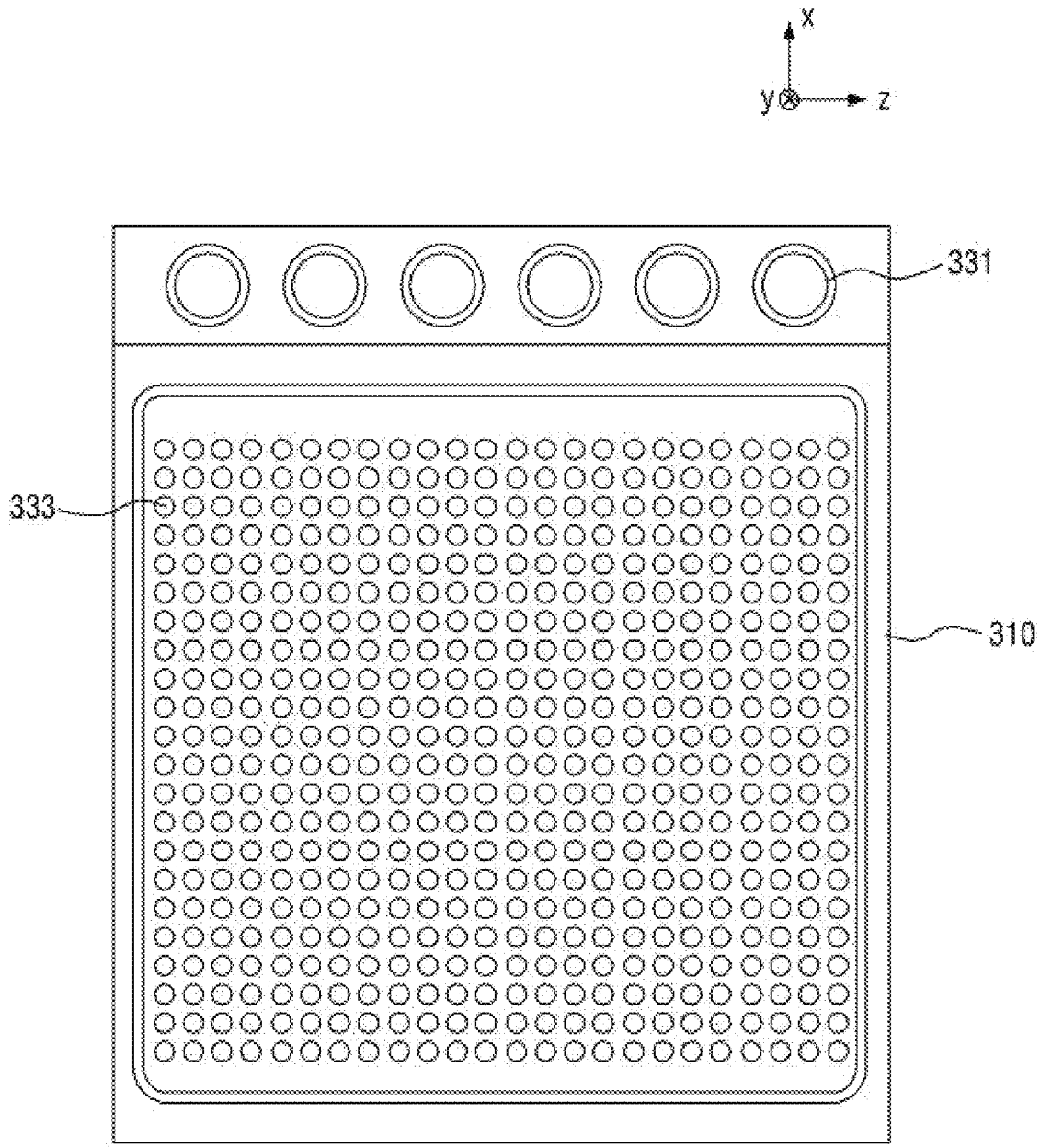
FIG. 13 is a bottom view illustrating the schematic structure of the exemplary embodiment of the upper fixing unit shown in FIG. 1.

FIGS. 12 and 13 are a cross-sectional view and a bottom view illustrating the schematic structure of an exemplary embodiment of the upper fixing unit 330 shown in FIG. 1.

Referring to FIGS. 12 and 13, an upper fixing unit 330 may be disposed in a bottom surface of the upper holding unit 310 as described above with reference to FIG. 1. The upper fixing unit 330 may include vacuum suction portions so as to fix the top surface of the first substrate 13 to the upper holding unit 310 by suction.

Specifically, the upper fixing unit 330 may include a plurality of first vacuum suction portions 331 provided in an edge portion of the bottom surface of the upper holding unit 310 and a plurality of second vacuum suction portions 333 formed in a portion of the bottom surface of the upper holding unit 310 where the first vacuum suction portions 331 are not formed.

The first vacuum suction portions 331 for vacuum-sucking a side of the top surface of the first substrate 13 may have a strong suction force. As shown in FIG. 13, the first vacuum suction portions 331 may be arranged in a line at an edge of the bottom surface of the upper holding unit 310. While the first vacuum suction portions 331 are formed at only one edge of the bottom surface of the upper holding unit 310 in the drawing, this is merely an exemplary embodiment, and the first vacuum suction portions 331 can additionally be formed at another edge. There is no restriction on the form of the first vacuum suction portions 331. The first vacuum suction portions 331 may be formed in the form of vacuum holes, for example. To have a stronger suction force, the first vacuum suction portions 331 may be formed in the form of suckers as shown in FIGS. 12 and 13.

The second vacuum suction portions 333 may be located in a portion of the bottom surface of the upper holding unit 310 excluding a portion where the first vacuum suction portions 331 are formed, as shown in FIG. 13. The second vacuum suction portions 333 may vacuum-suck the top surface of the first substrate 13, excluding the edges of the top surface. The second vacuum suction portions 333 are not required to have a strong suction force compared with the first vacuum suction portions 331. Thus, in one exemplary embodiment, the second vacuum suction portions 333 may be formed in the form of, but not limited to, vacuum holes.

Although not shown in FIG. 13, the upper fixing unit 330 may further include an auxiliary upper driving unit. In one exemplary embodiment, the auxiliary upper driving unit may move the first vacuum suction portions 331 in the Y-axis direction and may be formed in the form of, but not limited to, a cylinder.

Figure 14:
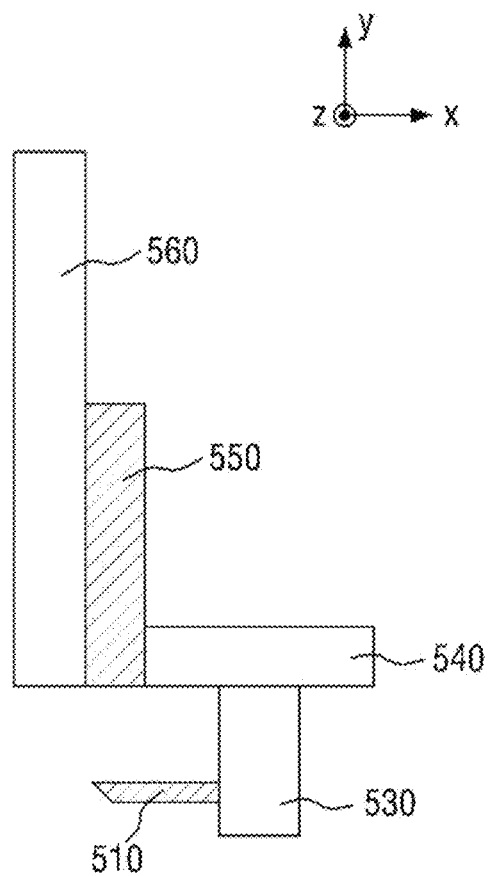
FIG. 14 is a cross-sectional view illustrating the schematic structure of an exemplary embodiment of a separator shown in FIG. 1.
Figure 15:
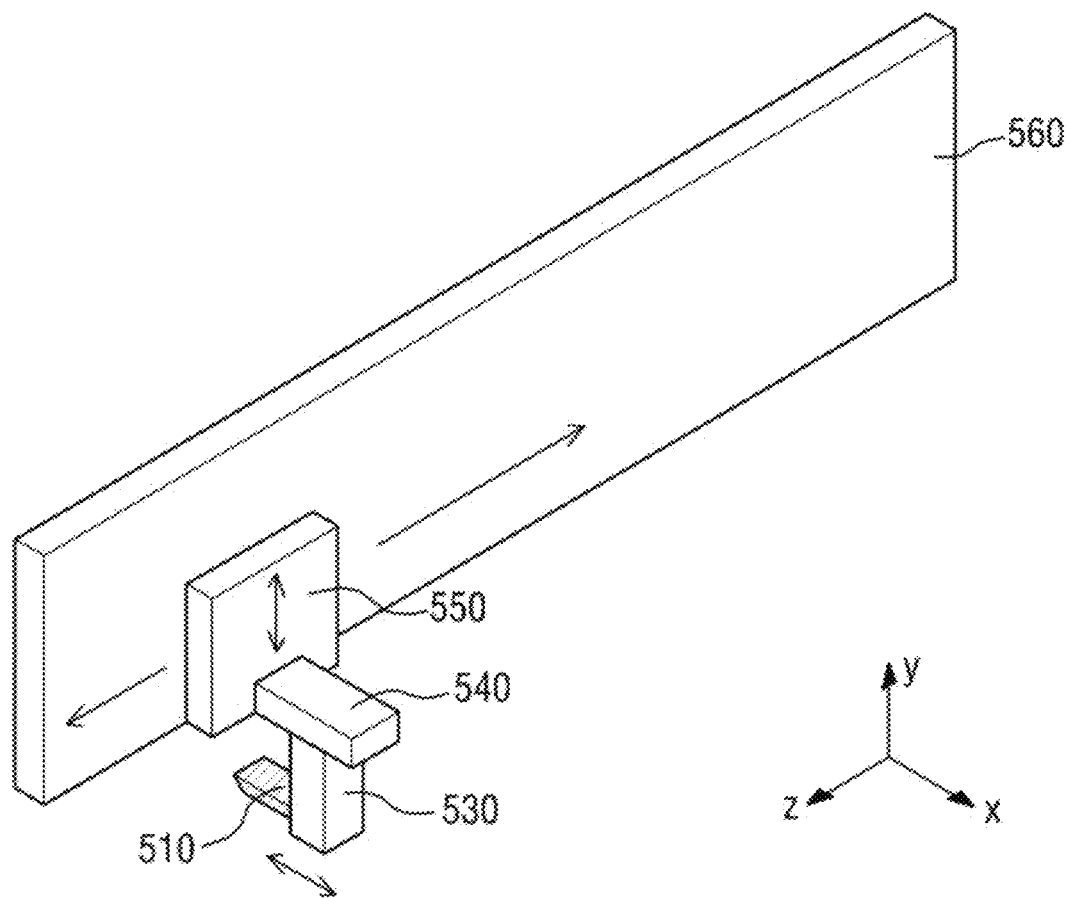
FIG. 15 is a perspective view illustrating the schematic structure of the exemplary embodiment of the separator shown in FIG. 1.

FIGS. 14 and 15 are a cross-sectional view and a perspective view illustrating the schematic structure of an exemplary embodiment of the separator 500 shown in FIG. 1.

Referring to FIGS. 14 and 15, a separator 500 according to the illustrated embodiment may include a knife 510 and a knife driving unit (not shown) for moving the knife 510 and may further include at least one of a first knife support 530, a second knife support 540, a third knife support 550 and a fourth knife support 560.

The first knife support 530 may support the knife 510 by fixing the knife 510 to a side of the first knife support 530. The first knife support 530 may be moved in the X-axis direction by the knife driving unit (not shown). Accordingly, the knife 510 fixed to the first knife support 530 may be moved in the X-axis direction. In one exemplary embodiment, the movement of the first knife support 530 in the X-axis direction may be guided by, but not limited to, the second knife support 540.

The second knife support 540 may be connected to the third knife support 550. The second knife support 540 may be moved in the Y-axis direction by the knife driving unit (not shown), thereby moving the knife 510 in the Y-axis direction. In one exemplary embodiment, the movement of the second knife support 540 may be guided by, but not limited to, the third knife support 550.

The third knife support 550 may be moved in the Z-axis direction by the knife driving unit (not shown), thereby moving the knife 510. Here, the movement of the third knife support 550 may be guided by the fourth knife support 560 which supports the third knife support 550.

However, the above coupling relationship among the first through fourth knife supports 530 through 560 is merely an exemplary embodiment, and the invention is not limited thereto. That is, there is no restriction on the coupling relationship among the first through fourth knife supports 530 through 560, and the coupling relationship among them can be changed appropriately when necessary. In addition, any one of the first through fourth knife supports 530 through 560 can be omitted.

Figure 16:
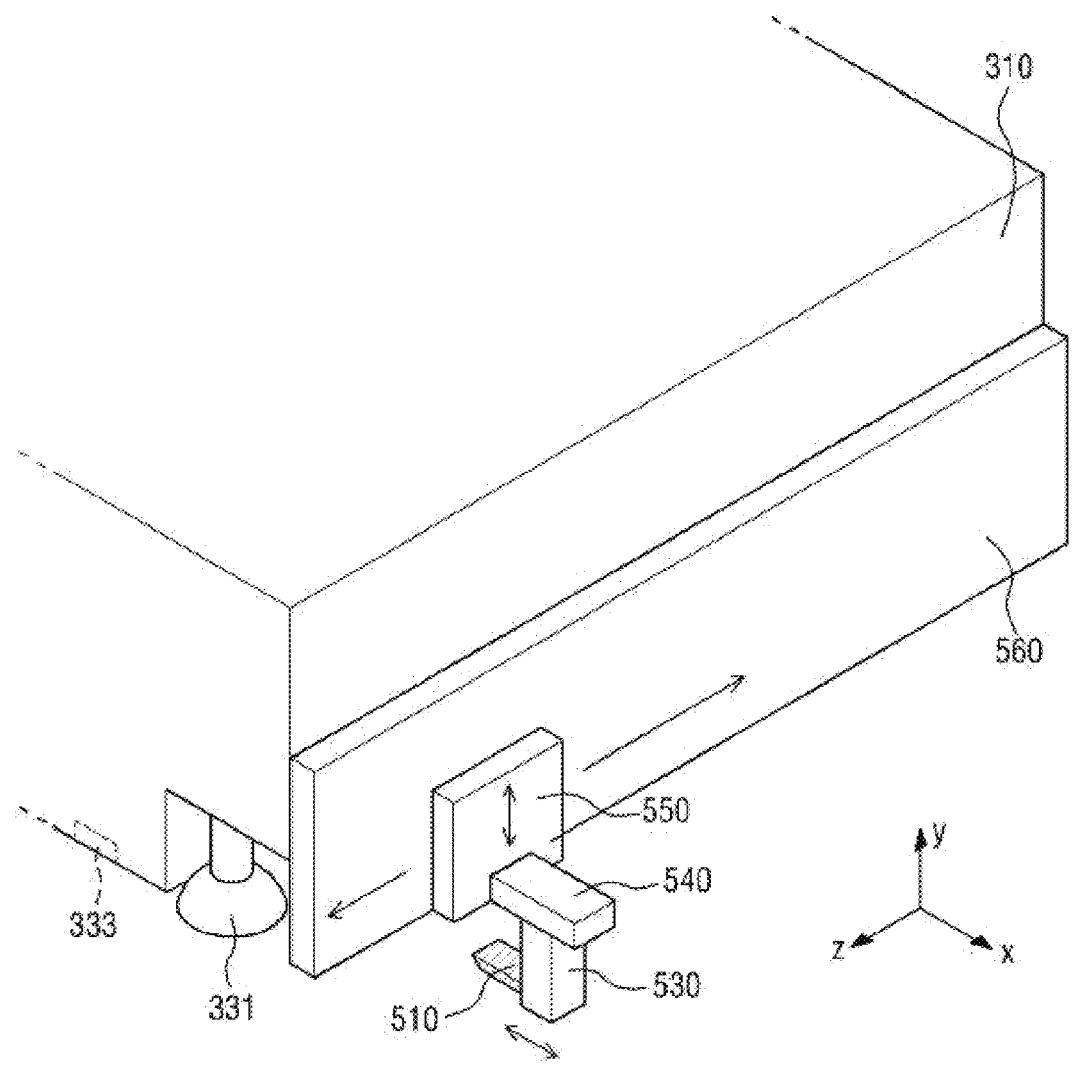
FIG. 16 is a perspective view illustrating the schematic structure of another exemplary embodiment of the separator shown in FIG. 1.

FIG. 16 is a perspective view illustrating the schematic structure of another exemplary embodiment of the separator 500 shown in FIG. 1. The structure of a separator 500 shown in FIG. 16 is similar to the structure shown in FIGS. 14 and 15.

Referring to FIG. 16, the separator 500 according to the illustrated embodiment may be formed integrally with the upper transfer part 300. A fourth knife support 560 of the separator 500 may be connected to the upper holding unit 310 of the upper transfer part 300, for example. Accordingly, the separator 500 may move in accordance with the movement of the upper holding unit 310 in a transfer process of the first substrate 13 (see FIG. 1) fixed by the upper fixing unit 300 (331, 333).

Figure 17:
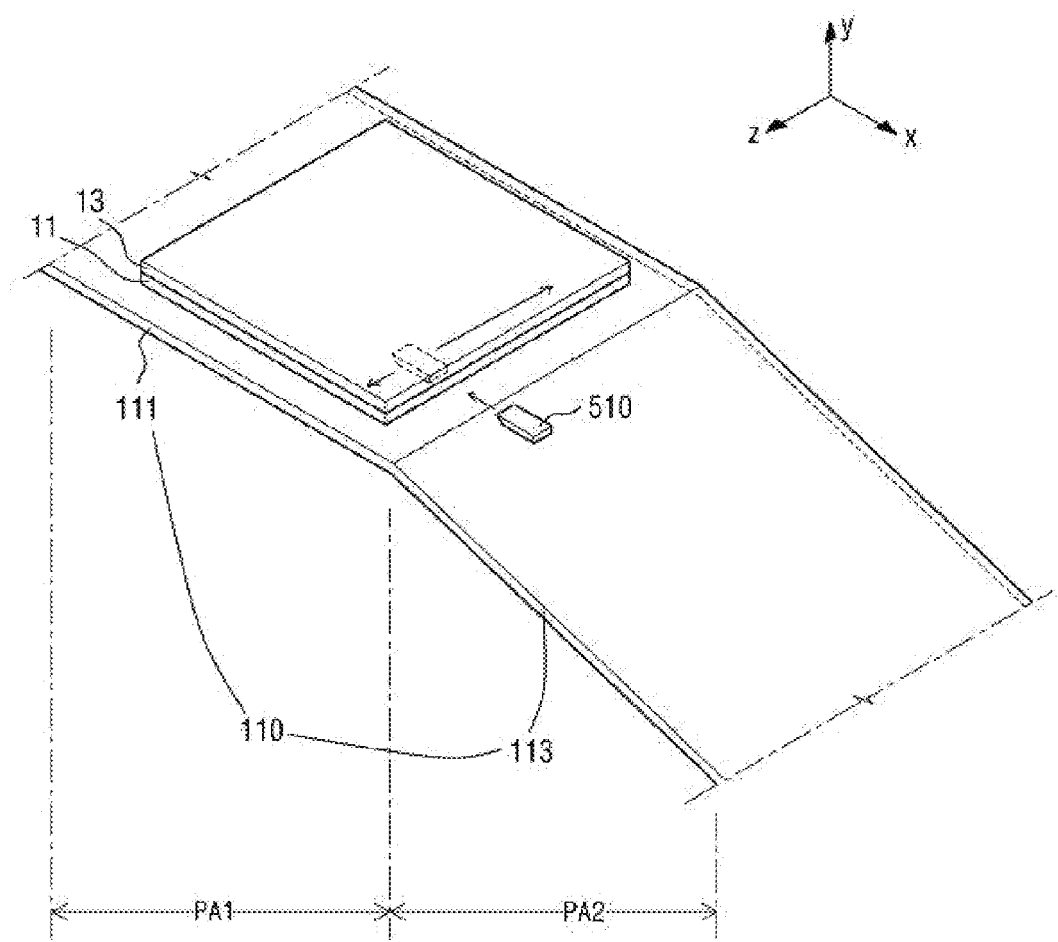
FIG. 17 is a perspective view illustrating the operation of the separator according to an exemplary embodiment of the invention.

FIG. 17 is a perspective view illustrating the operation of the separator 500 according to an exemplary embodiment of the invention.

Referring to FIG. 17, the knife 510 of the separator 500 may move in the negative X-axis direction to be inserted between the second substrate 11 and the first substrate 13. Then, the knife 510 may move along the Z-axis direction, thereby partially separating the second substrate 11 and the first substrate 13 which are in contact with each other. However, there is no restriction on the movement path of the knife 510 in the Z-axis direction. In an exemplary embodiment, the knife 510 inserted between the second substrate 11 and the first substrate 13 by moving in the negative X-axis direction may partially separate the first substrate 13 and the second substrate 11 by moving along the positive Z-axis direction and then partially separate the first substrate 13 and the second substrate 11 again by moving along the negative Z-axis direction. In another exemplary embodiment, the knife 510 may partially separate the first substrate 13 and the second substrate 11 by moving in the negative Z-axis direction and then in the positive Z-axis direction.

Figure 18:
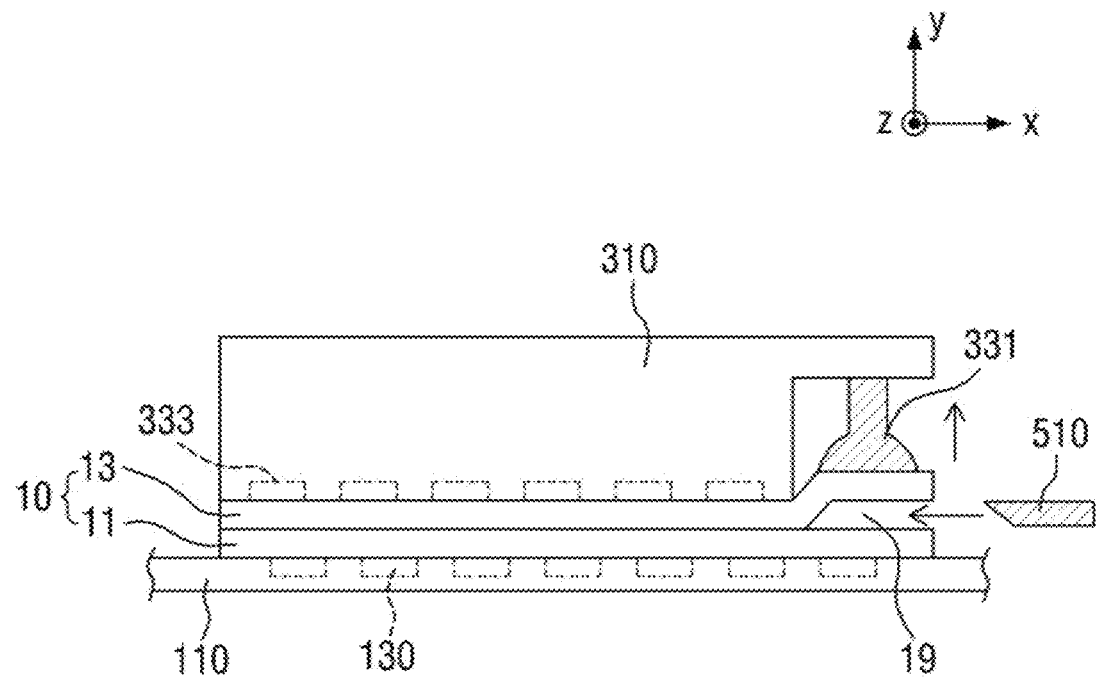
FIG. 18 is a schematic cross-sectional view illustrating the operation of the upper fixing unit and the separator according to an exemplary embodiment of the invention.

FIG. 18 is a schematic cross-sectional view illustrating the operation of the upper fixing unit 330 and the separator 500 according to an exemplary embodiment of the invention.

Referring to FIG. 18, as the upper fixing unit 330, the first vacuum suction portions 331 and the second vacuum suction portions 333 may be disposed under and in the lower part of the upper holding unit 310, as described above with reference to FIGS. 12 and 13. When the top surface of the first substrate 13 is fixed by the first vacuum suction portions 331 and the second vacuum suction portions 333 and where the bottom surface of the second substrate 11 is fixed by the lower fixing unit 130 of the lower holding unit 110, the first vacuum suction portions 331 may be moved in the positive Y-axis direction by the auxiliary upper driving unit. Accordingly, a portion of an edge of the first substrate 13 may be raised in an upward direction, that is, in the positive Y-axis direction, and a gap 19 may be formed between front surfaces of the first substrate 13 and the second substrate 11. In this state, the knife 510 may be inserted into the gap 19 by moving in the negative X-axis direction and may separate the first substrate 13 and the second substrate 11 in contact with each other by moving in the Z-axis direction. That is, according to the illustrated embodiment, since the gap 19 is formed between the second substrate 11 and the first substrate 13 using the first vacuum suction portions 331, the knife 510 can be inserted more easily between the two substrates 11 and 13.

Figure 19:
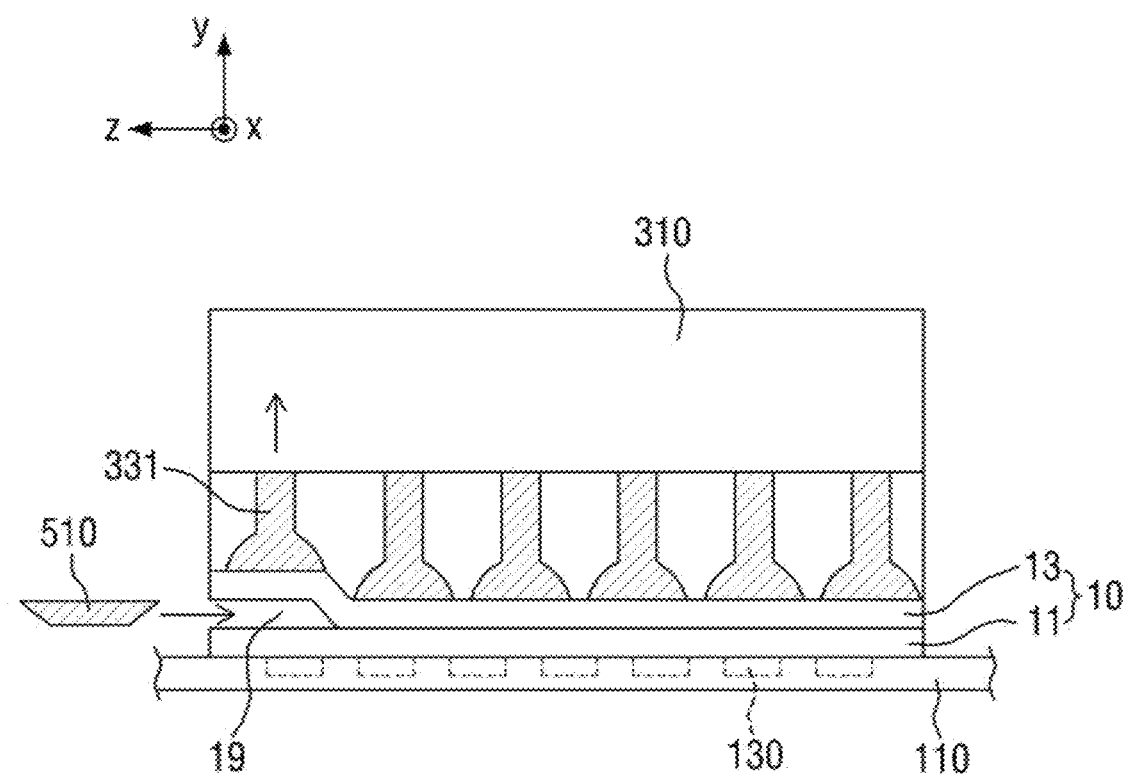
FIG. 19 is a schematic cross-sectional view illustrating the operation of the upper fixing unit and the separator according to another exemplary embodiment of the invention.

FIG. 19 is a schematic cross-sectional view illustrating the operation of the upper fixing unit 330 and the separator 500 according to another exemplary embodiment of the invention.

According to the illustrated embodiment, the first vacuum suction portions 331 for vacuum-sucking an edge of the top surface of the first substrate 13 may move in the Y-axis direction to form a gap 19 between side surfaces of the first substrate 13 and the second substrate 11. The knife 510 may move in the negative Z-axis direction from the side surfaces of the first substrate 13 and the second substrate 11 to be inserted into the gap 19 and may successively move in the negative Z-axis direction to separate the first substrate 13 and the second substrate 11 in contact with each other. That is, according to the illustrated embodiment, a direction in which the knife 510 is inserted between the first substrate 13 and the second substrate 11 is partially different from the direction described above with reference to FIG. 17. According to the illustrated embodiment, the knife 510 can be inserted more easily between the two substrates 11 and 13, and the direction in which the knife 510 is inserted between the first substrate 13 and the second substrate 11 is the same as the direction in which the knife 510 partially separates the first substrate 13 and the second substrate 11. Accordingly, it is possible to successively perform an operation of inserting the knife 510 between the first substrate 11 and the second substrate 13 and an operation of separating the first substrate 11 and the second substrate 13 using the knife 510.

Figure 20:
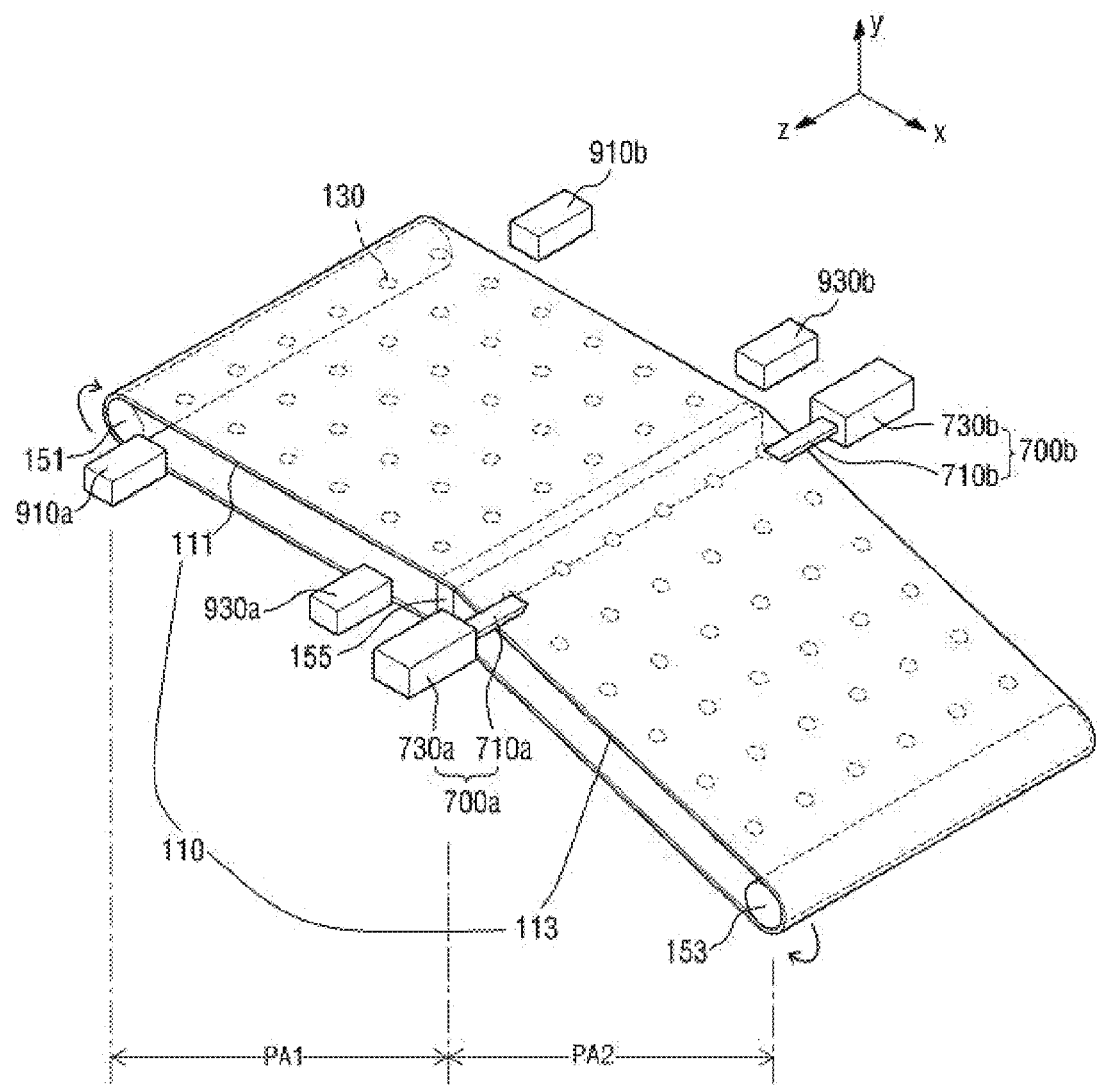
FIG. 20 is a schematic perspective view illustrating the disposition of auxiliary separators and ion generators according to an exemplary embodiment of the invention in a substrate separation apparatus according to the invention.

FIG. 20 is a schematic perspective view illustrating the disposition of auxiliary separators 700a and 700b and ion generators 910a, 910b, 930a and 930b according to an exemplary embodiment of the invention in a substrate separation apparatus according to the invention.

Referring to FIG. 20, the ion generators 930a and 930b may be disposed on sides of a boundary between a first transfer section 111 and a second transfer section 113. During a process or while a stacked structure 10 (see FIG. 1) is being transferred, static electricity may accumulate on the stacked structure 10 (see FIG. 1) disposed on the first transfer section 111 for substrate separation. The static electricity accumulated on the stacked structure 10 (see FIG. 1) may contaminate an exposed surface of the stacked structure 10 (see FIG. 1) because the charged surface attracts fine particles therearound. Therefore, when static electricity is generated on a second substrate 11 (see FIG. 1) or a first substrate 13 (see FIG. 1) in the process of separating the stacked structure 10 (see FIG. 1) into the second substrate 11 (see FIG. 1) and the first substrate 13 (see FIG. 1), a top surface of the second substrate 11 (see FIG. 1) or a bottom surface of the first substrate 13 (see FIG. 1) may be contaminated by the static electricity.

To address this problem, in the substrate separation apparatus according to the illustrated embodiment, the ion generators 930a and 930b are disposed on the sides of the boundary between the first transfer section 111 and the second transfer section 113. Therefore, it is possible to remove static electricity generated in the substrate separation process, thereby reducing or effectively preventing possible contamination in the substrate separation process.

In one exemplary embodiment, the ion generators 930a and 930b may be photoionizers. The photoionizers utilize air ionization without being affected by external conditions such as antistatic (i.e., removing static electricity) distance and wind direction, and utilize air ionization. Therefore, the photoionizers do not produce dust, electromagnetic waves and ozone. Also, due to their high ion generation density, the photoionizers are highly efficient in removing static electricity. When the ion generators 930a and 930b irradiate X-rays to the first substrate 13 (see FIG. 1) and the second substrate 11 (see FIG. 1) which are to be separated from each other, the X-rays may hit gases or atoms existing in the air to produce positive/negative ions. The positive/negative ions may neutralize static electricity charged on the first substrate 13 (see FIG. 1) and the second substrate 11 (see FIG. 1), thereby removing the static electricity. Accordingly, it is possible to effectively prevent the surface of the second substrate 11 (see FIG. 1) or the first substrate 13 (see FIG. 1) from being contaminated by the static electricity generated in the substrate separation process.

Even though two ion generators 930a and 930b are shown in FIG. 20, this is merely an exemplary embodiment, and there is no restriction on the number of the ion generators 930a and 930b. In addition, there is no restriction on the positions of the ion generators 930a and 930b as long as the ion generators 930a and 930b can supply ions to the top surface of the second substrate 11 (see FIG. 1) or the bottom surface of the first substrate 13 (see FIG. 1) in the substrate separation process.

Ion generators 910a and 910b may also be disposed on sides of the first transfer section 111. That is, the ion generators 910a and 910b disposed on the sides of the first transfer section 111 may supply ions to initially remove static electricity charged on the stacked structure 10 (see FIG. 1) or on at least one of the first substrate 13 (see FIG. 1) and the second substrate 11 (see FIG. 1) before the substrate separation process.

In FIG. 20, the ion generators 910a and 910b are disposed on both sides of the first transfer section 111. However, the ion generators 910a and 910b can be disposed on only one side of the first transfer section 111. Also, it is possible to place the ion generators 910a and 910b on the first transfer section 111 in order to supply ions simultaneously to all regions of the stacked structure 10 (see FIG. 1). That is, there is no restriction on the number and positions of the ion generators 910a and 910b.

The substrate separation apparatus according to the illustrated embodiment may further include the auxiliary separators 700a and 700b for partially separating the first substrate 13 (see FIG. 1) and the second substrate 11 (see FIG. 1). The auxiliary separators 700a and 700b may be disposed on both sides of the second transfer section 113 where the first substrate 13 (see FIG. 1) and the second substrate 11 (see FIG. 1) are separated by suction fixation and transfer. The auxiliary separators 700a and 700b may respectively include auxiliary knifes 710a and 710b which protrude along a Z-axis direction and auxiliary knife supports 730a and 730b which fix and support the auxiliary knifes 710a and 710b.

In an exemplary embodiment, the auxiliary knifes 710a and 710b protruding along the Z-axis direction may be disposed at a position at which the first substrate 13 (see FIG. 1) and the second substrate 11 (see FIG. 1) moving in a positive X-axis direction are separated from each other. In this case, the auxiliary knifes 710a and 710b may be inserted between the two substrates 11 and 13 (see FIG. 1) as the first substrate 13 (see FIG. 1) and the second substrate 11 (see FIG. 1) move. Here, as the first substrate 13 (see FIG. 1) and the second substrate 11 (see FIG. 1) move in a positive direction of an X axis, the first substrate 13 and the second substrate 11 may be separated in a negative direction of the X axis by the auxiliary knifes 710a and 710b. That is, the auxiliary knifes 710a and 710b may be fixed at a specified position, and the first substrate 13 (see FIG. 1) and the second substrate 11 (see FIG. 1) may be separated in a negative X-axis direction by the auxiliary knifes 710a and 710b as the first substrate 13 and the second substrate 11 move.

However, this is merely an exemplary embodiment, and the auxiliary separators 700a and 700b may further include driving units to move the auxiliary knifes 710a and 710b, respectively.

As for the positional relationship between the auxiliary separators 700a and 700b and the ion generators 930a and 930b, in one exemplary embodiment, the ion generators 930a and 930b are disposed closer to the first transfer section 111 than the auxiliary separators 700a and 700b in FIG. 20. However, this is merely an exemplary embodiment. That is, the auxiliary separators 700a and 700b can be disposed closer to the first transfer section 111 than the ion generators 930a and 930b.

As described above, since the second substrate 11 (see FIG. 1) and the first substrate 13 (see FIG. 1) which are in contact with each other can be separated further in the X-axis direction by using the auxiliary knifes 710a and 710b, the first substrate 13 and the second substrate 11 can be separated more easily.

Figure 21:
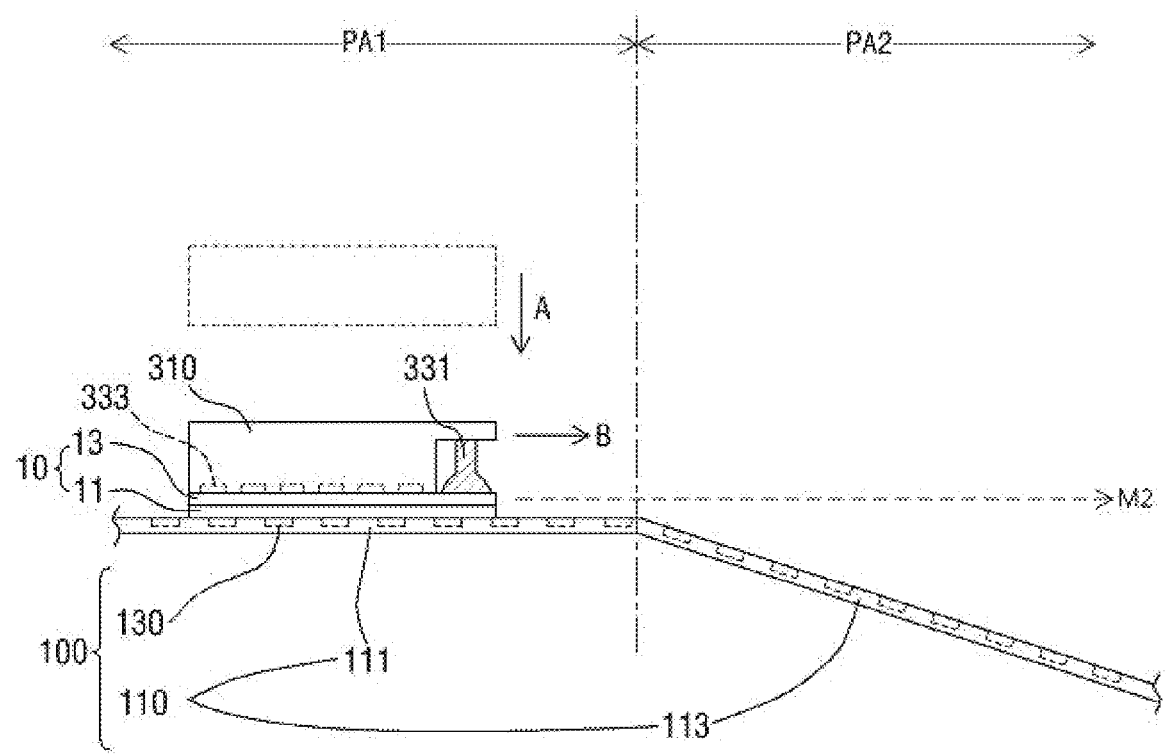
FIGS. 21 through 23 are cross-sectional views respectively illustrating steps of a substrate separation method and the operation of a substrate separation apparatus according to an exemplary embodiment of the invention.
Figure 22:
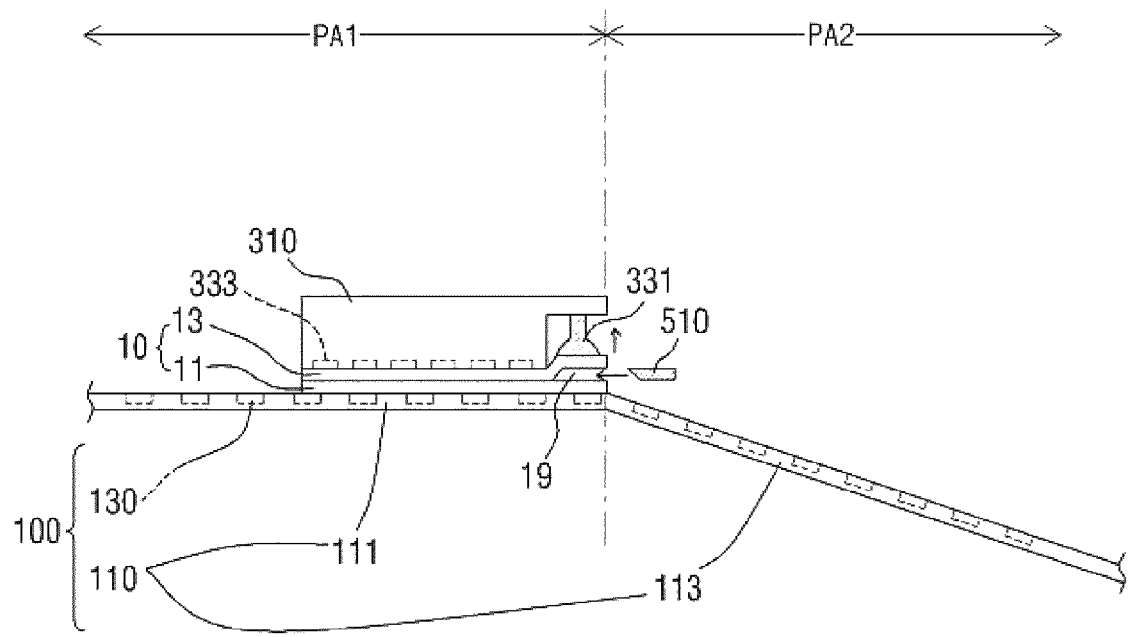
Figure 23:
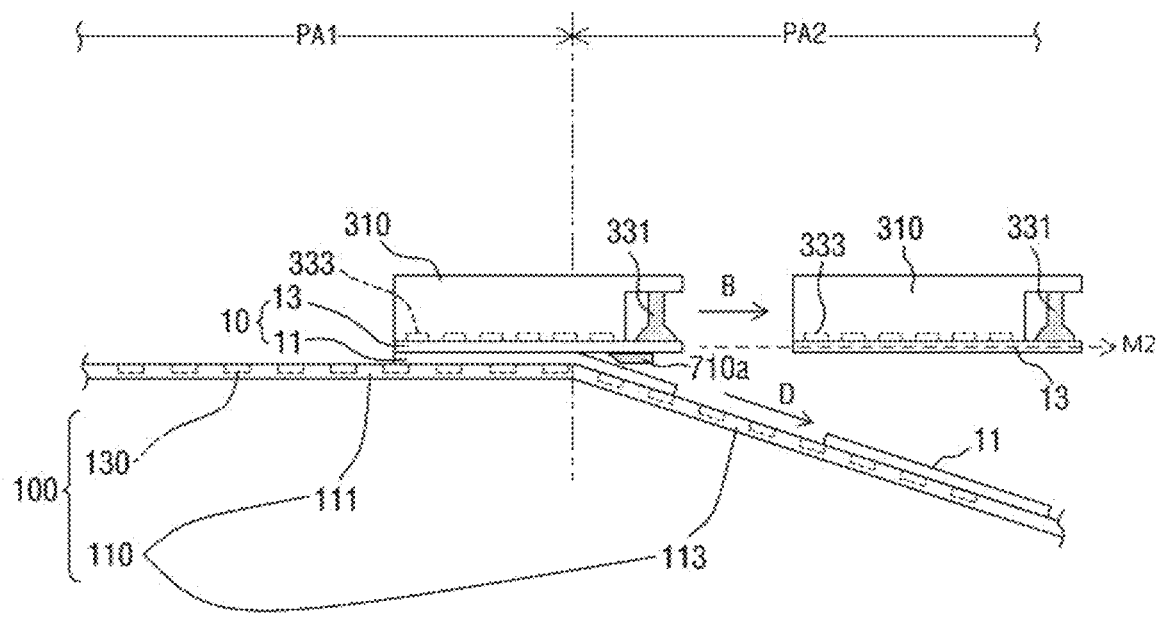
Figure 23:

FIGS. 21 through 23 are cross-sectional views respectively illustrating steps of a substrate separation method and the operation of a substrate separation apparatus according to an exemplary embodiment of the invention.

Referring to FIG. 21, a top surface of a first substrate 13 and a bottom surface of a second substrate 11 may be fixed.

Specifically, in one exemplary embodiment, a stacked structure 10 is disposed on a lower holding unit 110 of a lower transfer part 100, and the bottom surface of the second substrate 11 is fixed using a lower fixing unit 130. Then, an upper holding unit 310 of an upper transfer part 300 is disposed on the stacked structure 10 and moved in an A direction, i.e., a negative Y-axis direction, and the top surface of the first substrate 13 is fixed using an upper fixing unit (331, 333).

Alternatively, in another exemplary embodiment, although not shown in FIG. 21, the top surface of the first substrate 13 may be fixed first. When the stacked structure is fixed by the upper fixing unit (331, 333), the upper holding unit 310 may move to above the lower transfer part 100, for example. Then, the upper holding unit 310 may move in the negative Y-axis direction, i.e., the A direction to place the stacked structure 10 on the lower holding unit 110, and the lower fixing unit 130 may fix the bottom surface of the second substrate 11.

The first substrate 13 having the top surface fixed and the second substrate 11 having the bottom surface fixed are transferred together in a B direction, i.e., a positive X-axis direction in a first area PA1. Specifically, the upper holding unit 310 transfers the first substrate 13 having the top surface fixed by the upper fixing unit (331, 333) by moving in the B direction, i.e., the positive X-axis direction, and, at the same time, the second substrate 11 having the bottom surface fixed by the lower fixing unit 130 is transferred in the positive X-axis direction along a first transfer section 111.

In other words, the first substrate 13 having the top surface fixed may be moved along a straight line M2 in the first area PA1, where the straight line M2 may be parallel to an X axis.

In addition, the second substrate 11 having the bottom surface fixed may be transferred along the first transfer section 111 whose vertical distance from the straight line M2 is constant.

Referring to FIG. 22, the first substrate 13 and the second substrate 11 may initially be separated in the first area PA1 or at a boundary between the first area PA1 and a second area PA2.

Specifically, the first substrate 13 and the second substrate 11 are stopped before entering the second area PA2. That is, the movement of the upper holding unit 310 and the movement of the lower holding unit 110 may be stopped. Then, a knife 510 of a separator is moved in a negative X-axis direction to be inserted between the first substrate 13 and the second substrate 11 and is moved in a Z-axis direction to partially separate the first substrate 13 and the second substrate 11 which are in contact with each other.

Additionally, a process of forming a gap 19 between the first substrate 13 and the second substrate 11 by moving first vacuum suction portions 331 of the upper fixing unit (331, 333), which fix an edge of the top surface of the first substrate 11, in a positive Y-axis direction may further be performed. In this case, the gap 19 makes it easier to insert the knife 510 between the first substrate 13 and the second substrate 11 as described above with reference to FIG. 18.

Although not shown in FIG. 22, in one exemplary embodiment, the gap 19 may also be formed between side surfaces of the first substrate 13 and the second substrate 11 as described above with reference to FIG. 19. In this case, the knife 510 may move in a negative Z-axis direction to be inserted into the gap 19.

Referring to FIG. 23, the first substrate 13 and the second substrate 11 are gradually separated as they are moved in the second area PA2.

Specifically, the first substrate 13 having the top surface fixed by the upper fixing unit (331, 333) is transferred in the positive X-axis direction by moving the upper holding unit 310 in the B direction, i.e., the positive X-axis direction. At the same time, the second substrate 11 having the bottom surface fixed by the lower fixing unit 130 is transferred along the second transfer section 113 in a D direction, i.e., a direction indicated by the sum of the positive X-axis direction and the negative Y-axis direction. That is, in a second transfer section 113, the second substrate 11 is transferred in a positive direction of an X axis and in a negative direction of a Y axis. Accordingly, a force that fixes the top surface of the first substrate 13, a force that moves the first substrate 13 in the positive X-axis direction, a force that fixes the bottom surface of the second substrate 11, and a force that moves the second substrate 11 in the positive X-axis direction and the negative Y-axis direction act as external forces that can gradually separate the first substrate 13 and the second substrate 11.

In other words, the first substrate 13 having the top surface fixed may be transferred along the above straight line M2 in the second area PA2, and the second substrate 11 having the bottom surface fixed may be transferred along the second transfer section 113 whose vertical distance from the straight line M2 increases. Accordingly, the first substrate 13 and the second substrate 11 may be gradually separated from each other.

Here, since the second substrate 11 is flexible, the separation of the second substrate 11 from the first substrate 13 may be gradually achieved from the boundary between the first transfer section 111 and the second transfer section 113 or between the first area PA1 and the second area PA2.

An auxiliary separator including an auxiliary knife 710a may further be disposed on a side of the second transfer section 113 to further separate the first substrate 13 and the second substrate 11 as described above with reference to FIG. 20.

Although not shown in FIG. 23, in one exemplary embodiment, ion generators 930a and 930b (see FIG. 20) may be disposed on sides of the boundary between the first area PA1 and the second area PA2 or between the first transfer section 111 and the second transfer section 113 at which the separation of the first substrate 13 and the second substrate 11 begins. In this case, the ion generators 930a and 930b may supply ions to the separated surfaces of the first substrate 13 and the second substrate 11, thereby removing static electricity as described above with reference to FIG. 20. Before the separation of the first substrate 13 and the second substrate 11, static electricity charged on the stacked structure 10 can also be initially removed by supplying ions using ion generators 910a and 910b (see FIG. 20) as described above with reference to FIG. 20.

Exemplary embodiments of the invention provide at least one of the following advantages.

It is possible to separate a first substrate and a second substrate more stably by gradually increasing a gap between the first substrate and the second substrate. It is also possible to minimize the probability of substrate damage in the separation process.

Furthermore, it is possible to minimize the effect of static electricity by controlling the static electricity in the separation process and reduce or effectively prevent contamination due to foreign substances.

However, the effects of the invention are not restricted to the one set forth herein. The above and other effects of the invention will become more apparent to one of ordinary skill in the art to which the invention pertains by referencing the claims.

While the invention has been particularly shown and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of separating a first substrate and a second substrate which are in contact with each other, the method comprising:
applying a first force to a bottom surface of the second substrate to maintain the second substrate fixed to a lower transferring member and applying a second force to a top surface of the first substrate to maintain the first substrate fixed to an upper transferring member;
in an XY coordinate system comprised of an X axis and an Y axis which perpendicularly intersect each other,
transferring the first and second substrates in contact with each other and fixed to the transferring members, in a positive X-axis direction in a first area, by:
the upper transferring member applying a first positive X-axis direction force to the first substrate fixed thereto, and
the lower transferring member applying a second positive X-axis direction force to the second substrate fixed thereto; and
with the first and second substrates fixed to the transferring members, separating the first substrate from the second substrate in a second area following the first area along the positive X-axis direction, by:
the applying the second force to the top surface of the first substrate to maintain the first substrate fixed to the upper transferring member and the upper transferring member applying the first positive X-axis direction force to the first substrate fixed thereto, at the same time as
the applying the first force to the bottom surface of the second substrate to maintain the second substrate fixed to the lower transferring member and the lower transferring member applying both the second positive X-axis direction force and a negative Y-axis direction force to the second substrate fixed thereto.

2. The method of claim 1, further comprising, before the separating the first substrate from the second substrate,
partially separating the first substrate from the second substrate in contact with the first substrate, in the first area or at a boundary between the first area and the second area, by moving a portion of the first substrate away from the second substrate in a Z-axis direction which perpendicularly intersects the X axis and the Y axis.

3. The method of claim 2, wherein the partially separating of the first substrate from the second substrate comprises:
inserting a knife between the first substrate and the second substrate; and
moving the knife in the Z-axis direction.

4. The method of claim 2, further comprising the upper and lower transferring members respectively stopping the applying the first and second positive X-axis direction forces to the first substrate and the second substrate before the partially separating the first substrate from the second substrate.

5. The method of claim 1, further comprising neutralizing static electricity charged on at least one of the second substrate and the first substrate by supplying ions using one or more ion generators before the separating the first substrate from the second substrate.

6. A method of separating a first substrate and a second substrate which are in contact with each other, the method comprising:
fixing a bottom surface of the second substrate and a top surface of the first substrate to lower and upper holding units different from each other, respectively;
transferring the upper holding unit with the first substrate fixed thereto along a straight line; and
transferring the lower holding unit with the second substrate fixed thereto in a different direction than the straight line at the same time as the transferring the upper holding unit with the first substrate fixed thereto along the straight line, to separate the first substrate and the second substrate from each other,
wherein the lower holding unit comprises:
a first transfer section of which a vertical distance from the straight line remains unchanged, and
a second transfer section of which the vertical distance from the straight line increases.

7. The method of claim 6,
wherein each of the first transfer section and the second transfer section has a top surface on which the second substrate is disposed, and
wherein an angle formed by the top surface of the first transfer section and the top surface of the second transfer section ranges from greater than about 135 degrees to less than about 180 degrees.

8. The method of claim 7, wherein the top surface of the second transfer section comprises a sloping surface, and the sloping surface comprises a flat surface or a curved surface.

* * * * *